(12) United States Patent
Takamura et al.

(10) Patent No.: US 6,437,964 B1
(45) Date of Patent: Aug. 20, 2002

(54) CAPACITIVE ELEMENT DRIVING APPARATUS

(75) Inventors: Jun Takamura, Mishima; Noboru Nitta; Shunichi Ono, both of Shizuoka-ken, all of (JP)

(73) Assignee: Toshiba Tec Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/559,864

(22) Filed: Apr. 27, 2000

(30) Foreign Application Priority Data

Apr. 30, 1999 (JP) ............................................. 11-124582
Feb. 25, 2000 (JP) ....................................... 2000-049752

(51) Int. Cl.$^7$ ................................................ H02N 2/00
(52) U.S. Cl. .......................... 361/235; 361/233; 347/79
(58) Field of Search ................................ 307/85–87, 38, 307/98, 99; 361/225–228, 230, 233, 235; 347/5, 9, 10, 14, 12, 19, 74, 78, 79, 80, 81

(56) References Cited

U.S. PATENT DOCUMENTS

| 4,714,935 A | | 12/1987 | Yamamoto et al. | |
| 5,266,965 A | * | 11/1993 | Komai et al. | ................ 347/12 |
| 5,384,583 A | * | 1/1995 | Katerberg et al. | ............ 347/19 |
| 6,068,360 A | * | 5/2000 | Hiwada | ....................... 347/14 |

FOREIGN PATENT DOCUMENTS

| JP | 59-224356 | 12/1984 | |
| JP | 5-347545 | 12/1993 | .......... H03K/17/16 |
| JP | 7-178898 | 7/1995 | ............ B41J/2/045 |

OTHER PUBLICATIONS

U.S. Patent Application Ser. No. 09/951,196 Filed: Sep. 13, 2001; Applicants: Jun Takamura et al Title: Method and Apparatus for Driving Capacitive Element.

* cited by examiner

Primary Examiner—Ronald W. Leja
(74) Attorney, Agent, or Firm—Frishauf, Holtz, Goodman & Chick, P.C.

(57) ABSTRACT

In a capacitive element driving apparatus which changes, by an output circuit, the electrode potentials of the electrostatic capacitive element of a transducer forming a capacitive load such as a piezoelectric member to drive and control the electrostatic capacitive element, when the electrode potentials start changing and simultaneously change in the same direction by the function of a same-direction detection circuit, the potentials to be applied to the electrodes are controlled with a high impedance. While a portion between the electrodes of the electrostatic capacitive element of the transducer is being charged or discharged, the potentials to be applied are controlled with a low impedance lower than the high impedance.

12 Claims, 20 Drawing Sheets

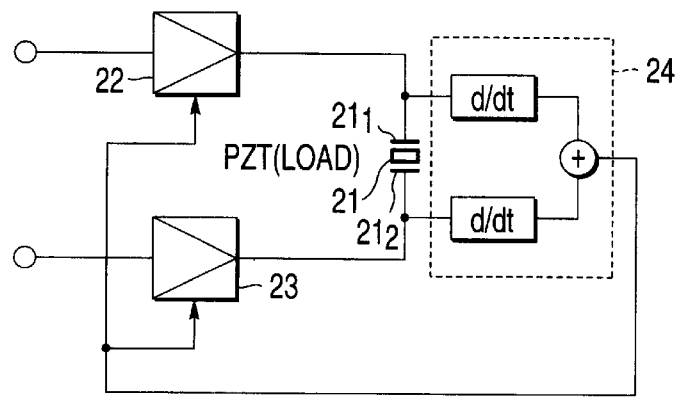
F I G. 1
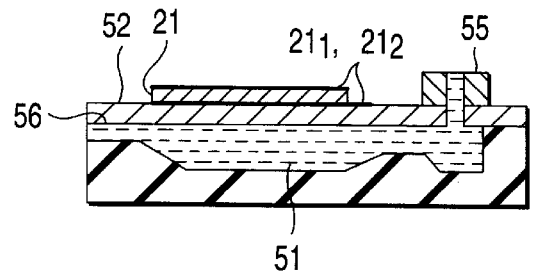
INITIAL STATE
F I G. 3A
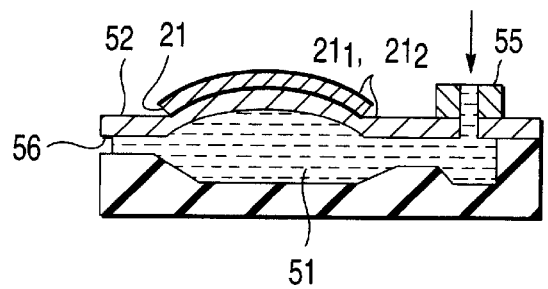
REVERSE CHARGE
F I G. 3B
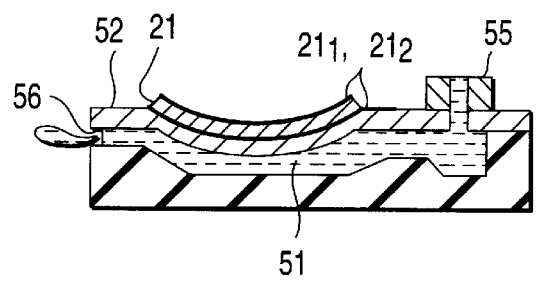
DISCHARGE+CHARGE
F I G. 3C
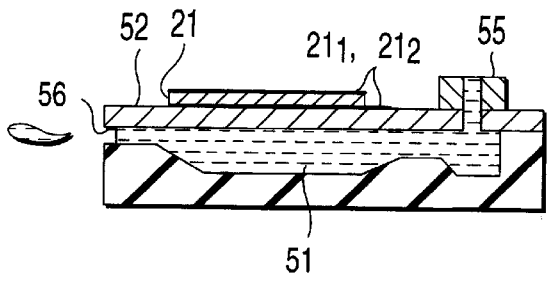
REVERSE DISCHARGE
F I G. 3D

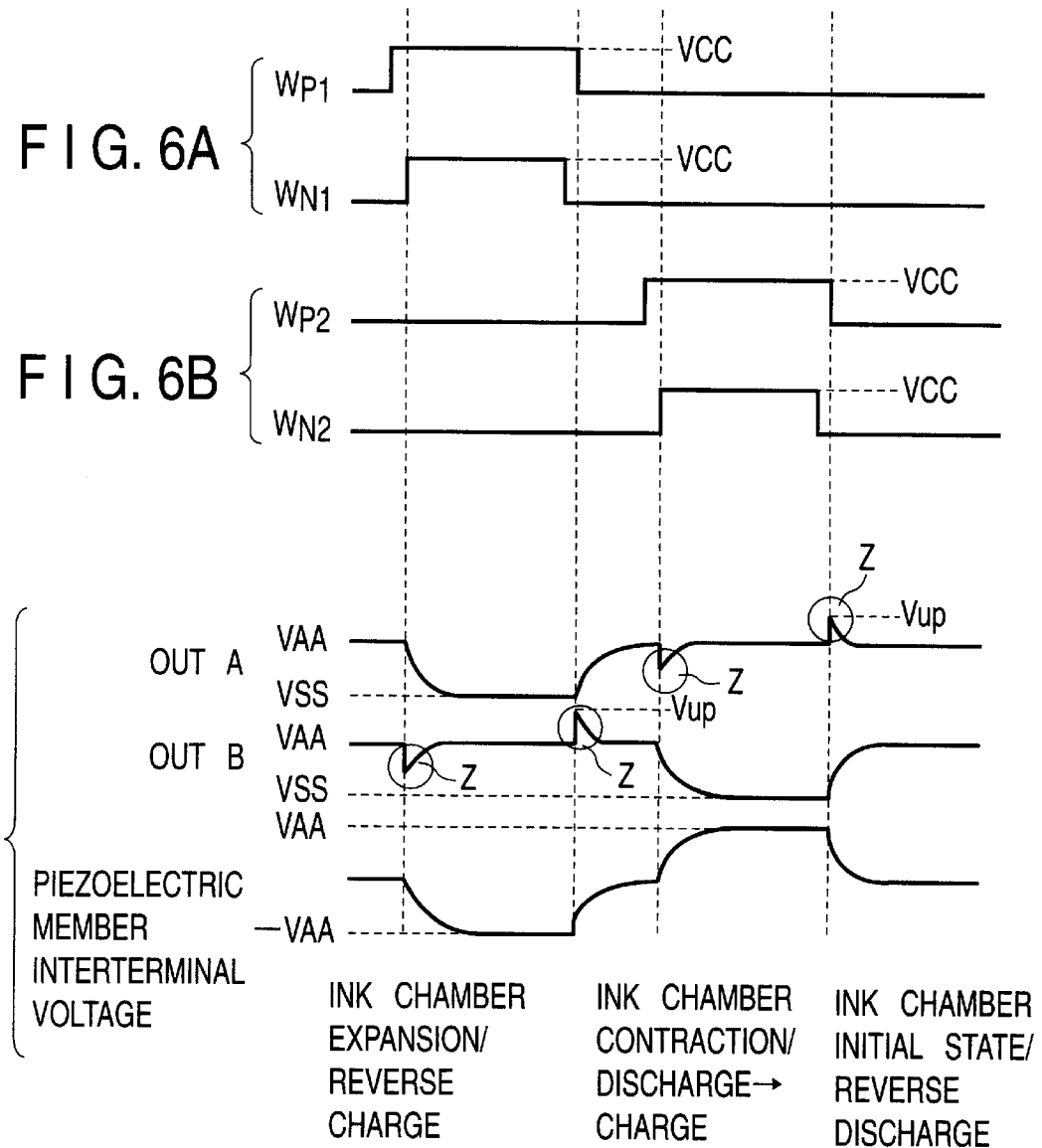
FIG. 6A
FIG. 6B
FIG. 6C
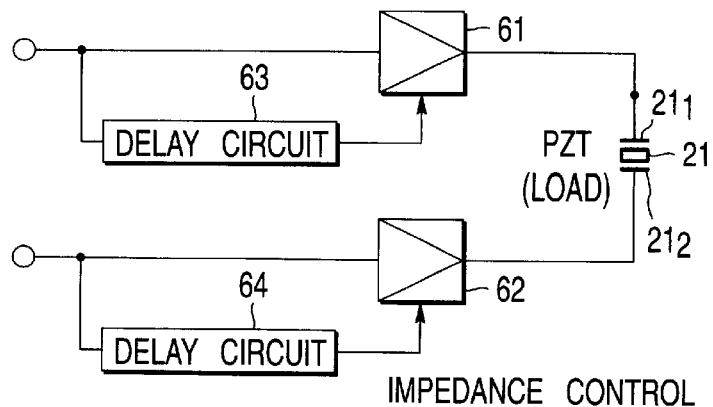
FIG. 7

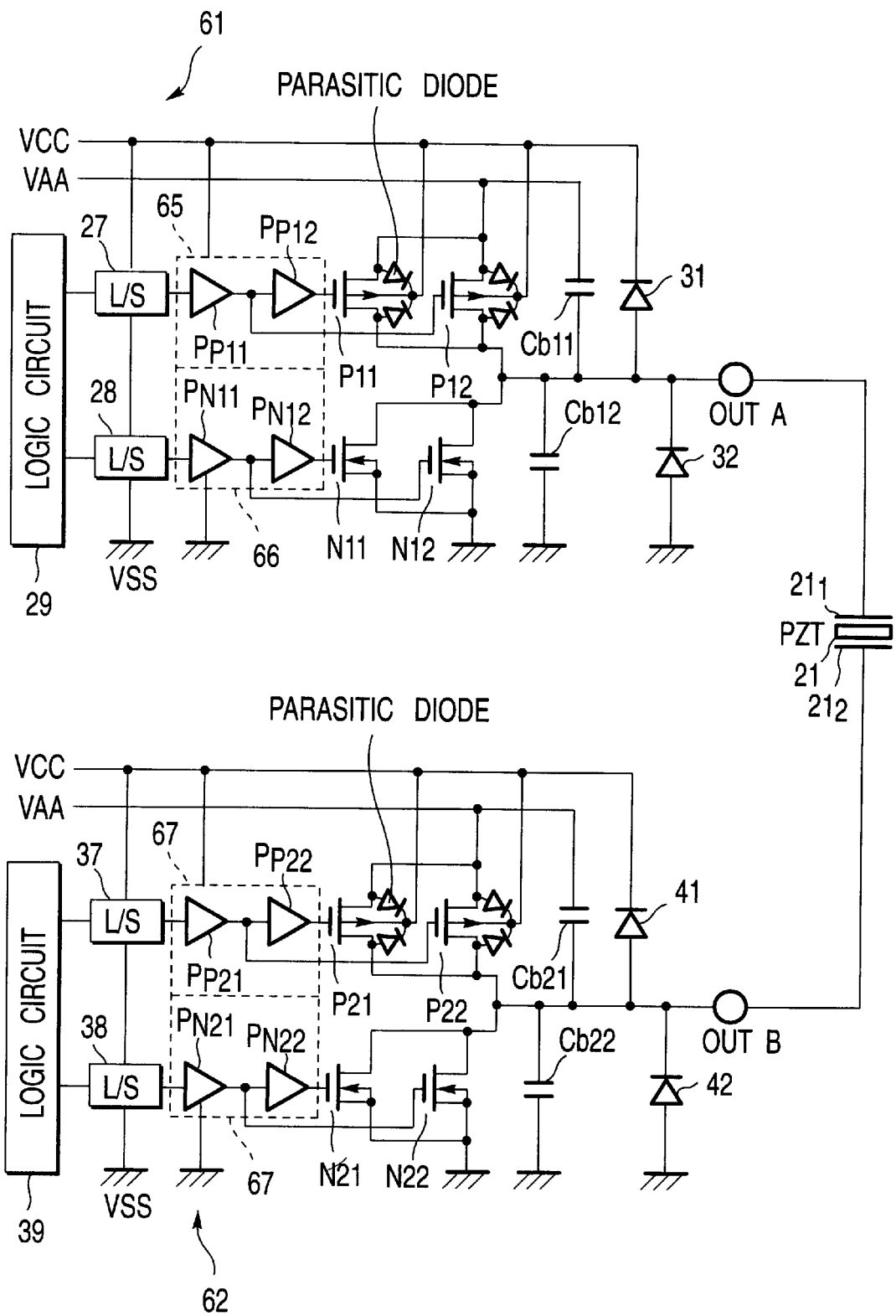
F I G. 8

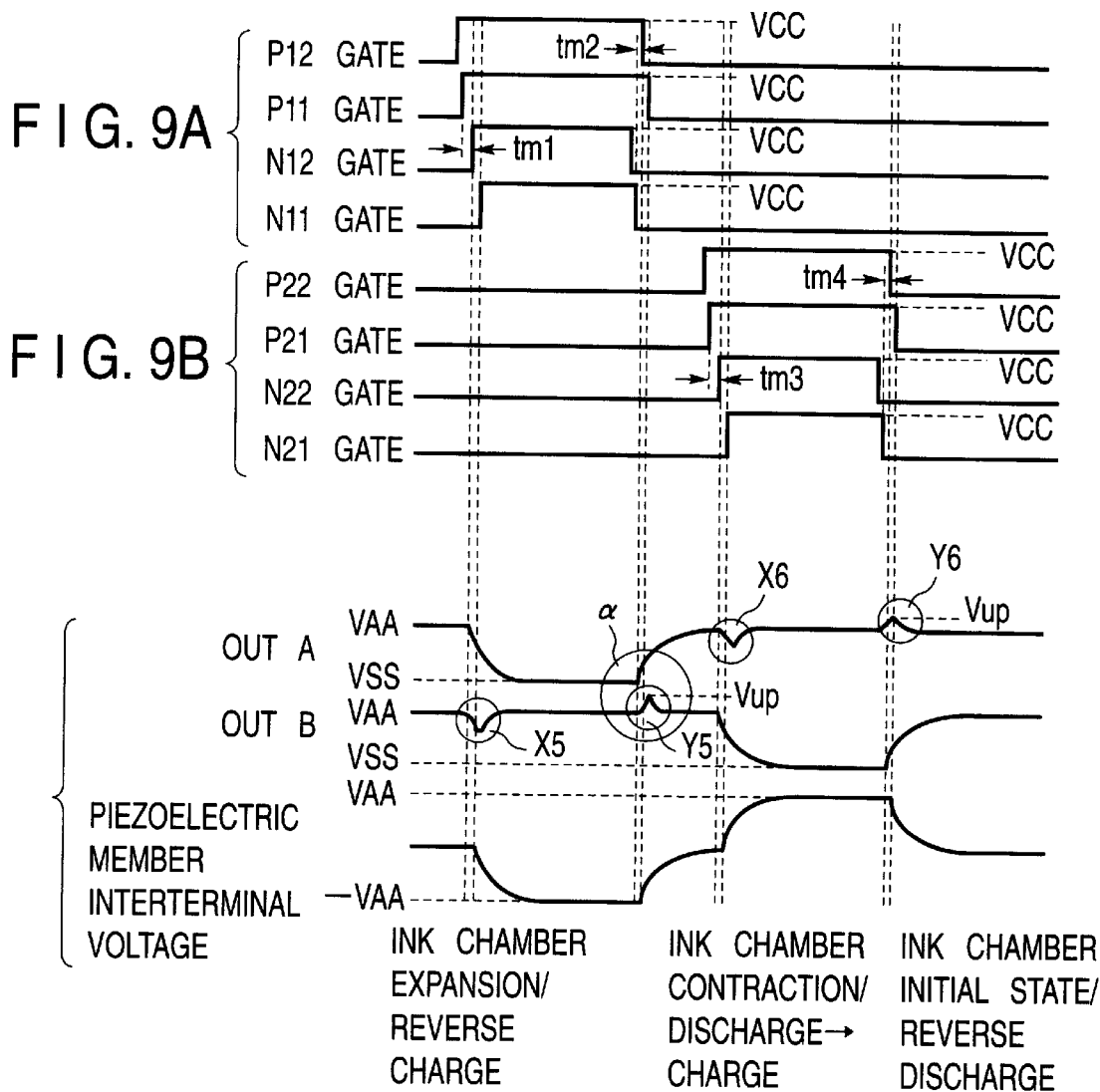
FIG. 9A
FIG. 9B
FIG. 9C
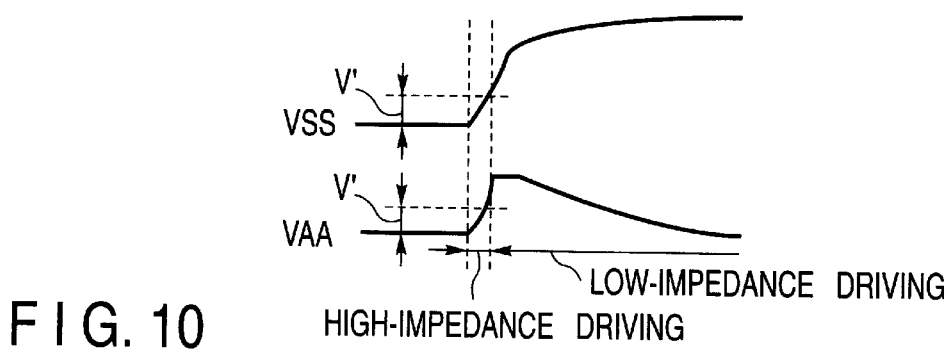
FIG. 10

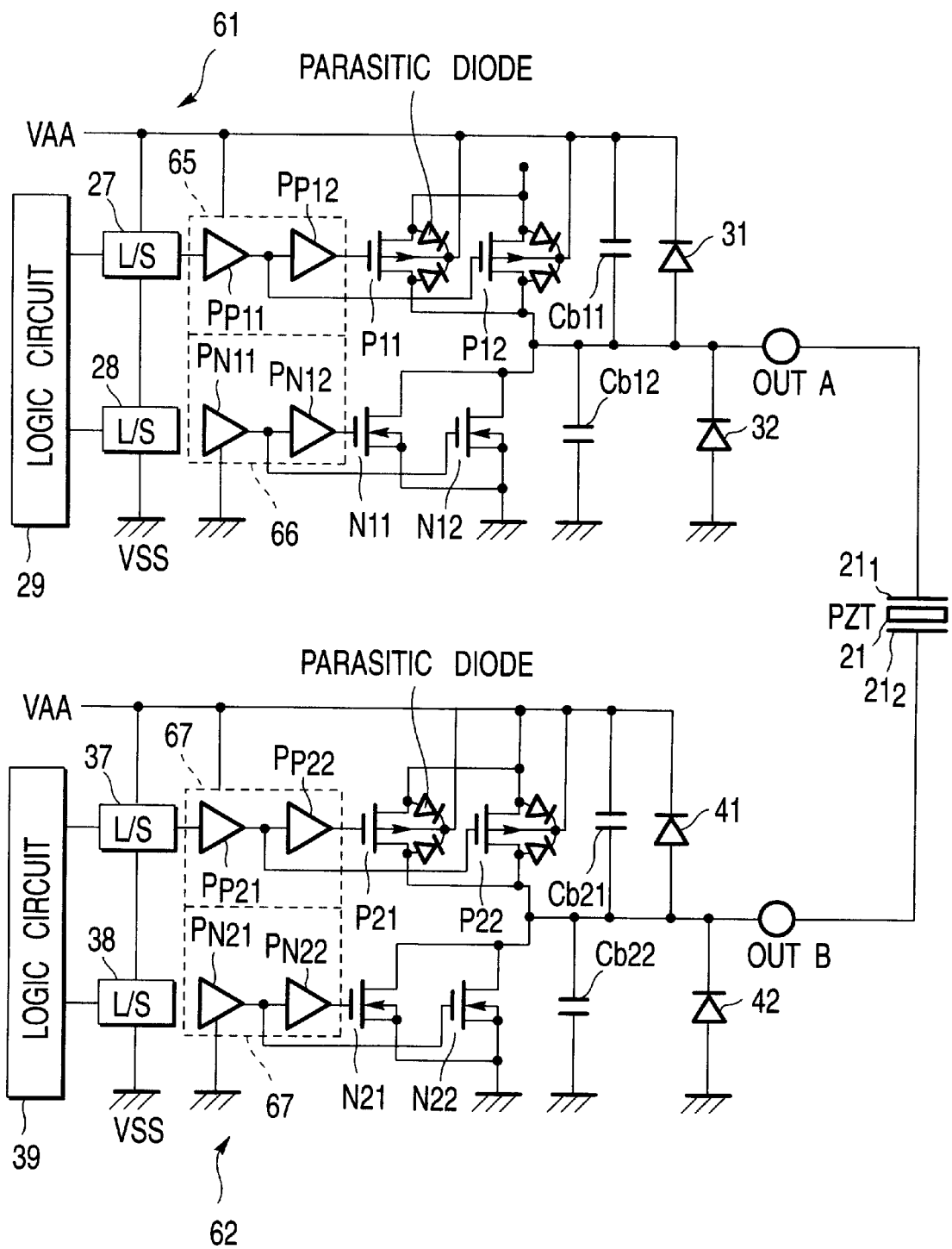
F I G. 11

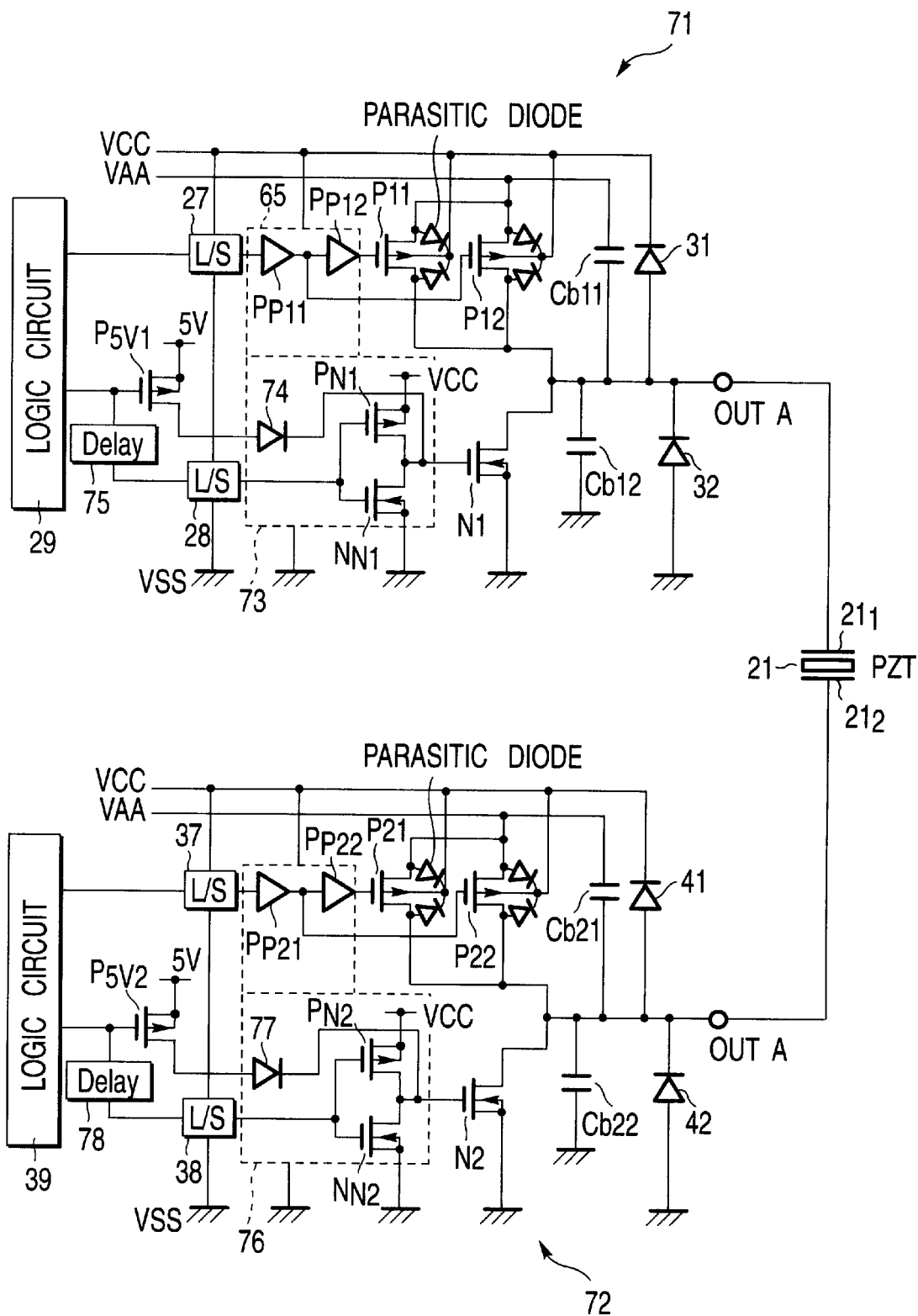
F I G. 12

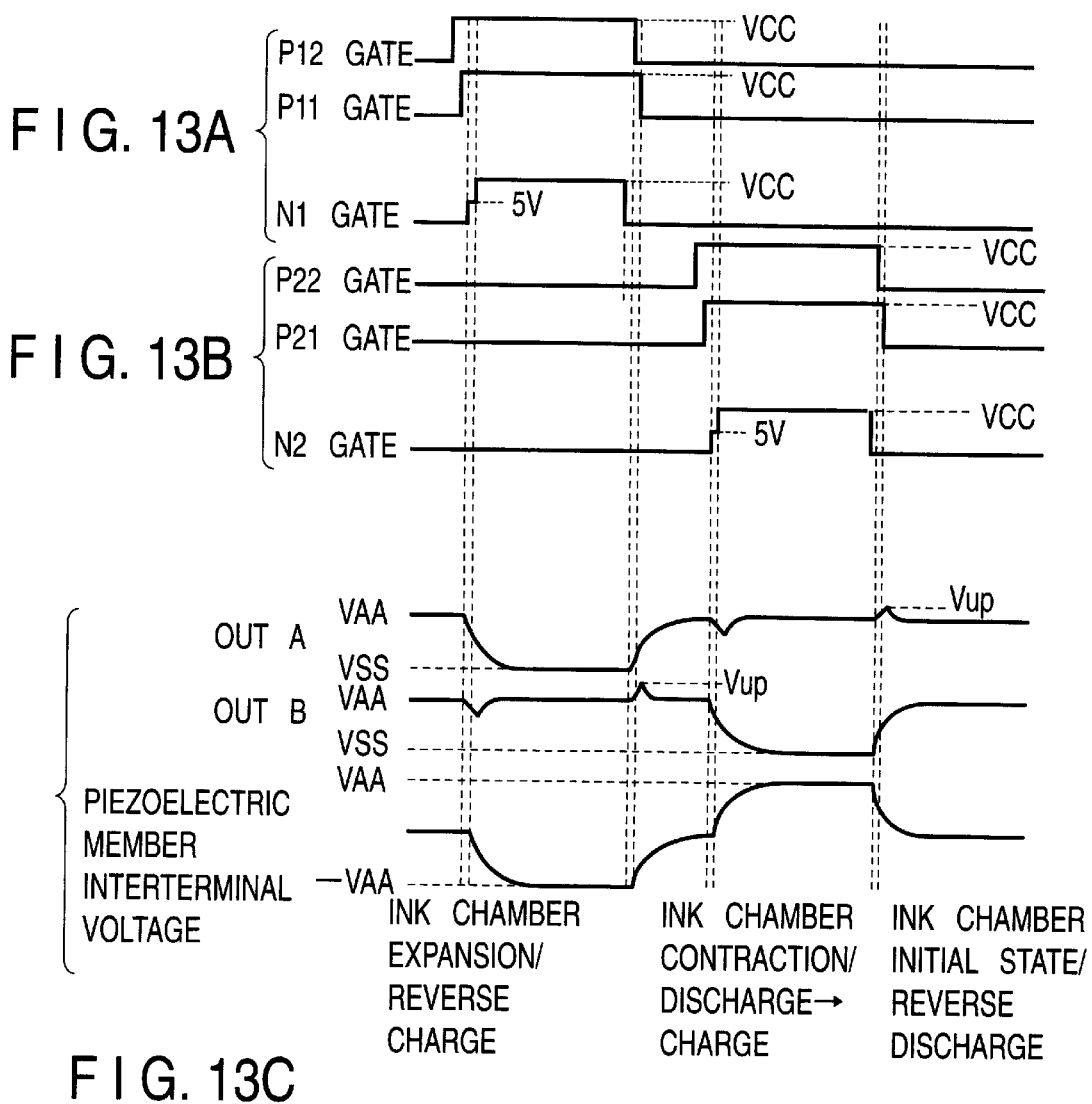
FIG. 13A
FIG. 13B
FIG. 13C
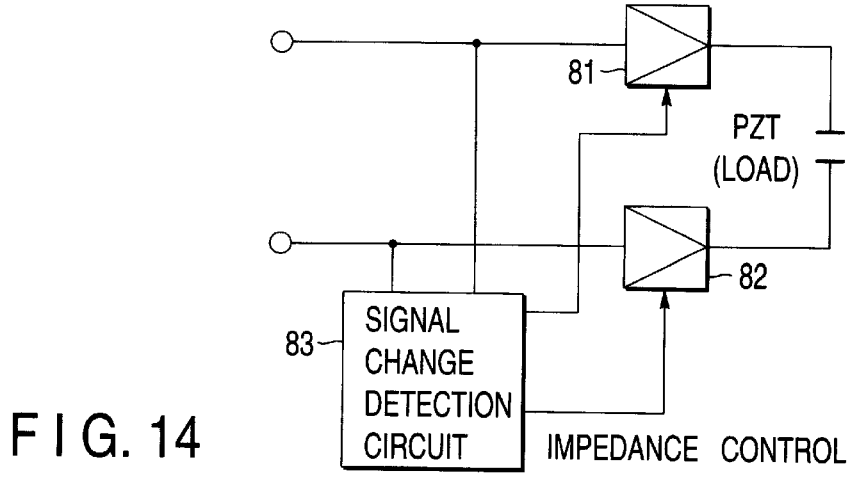
FIG. 14

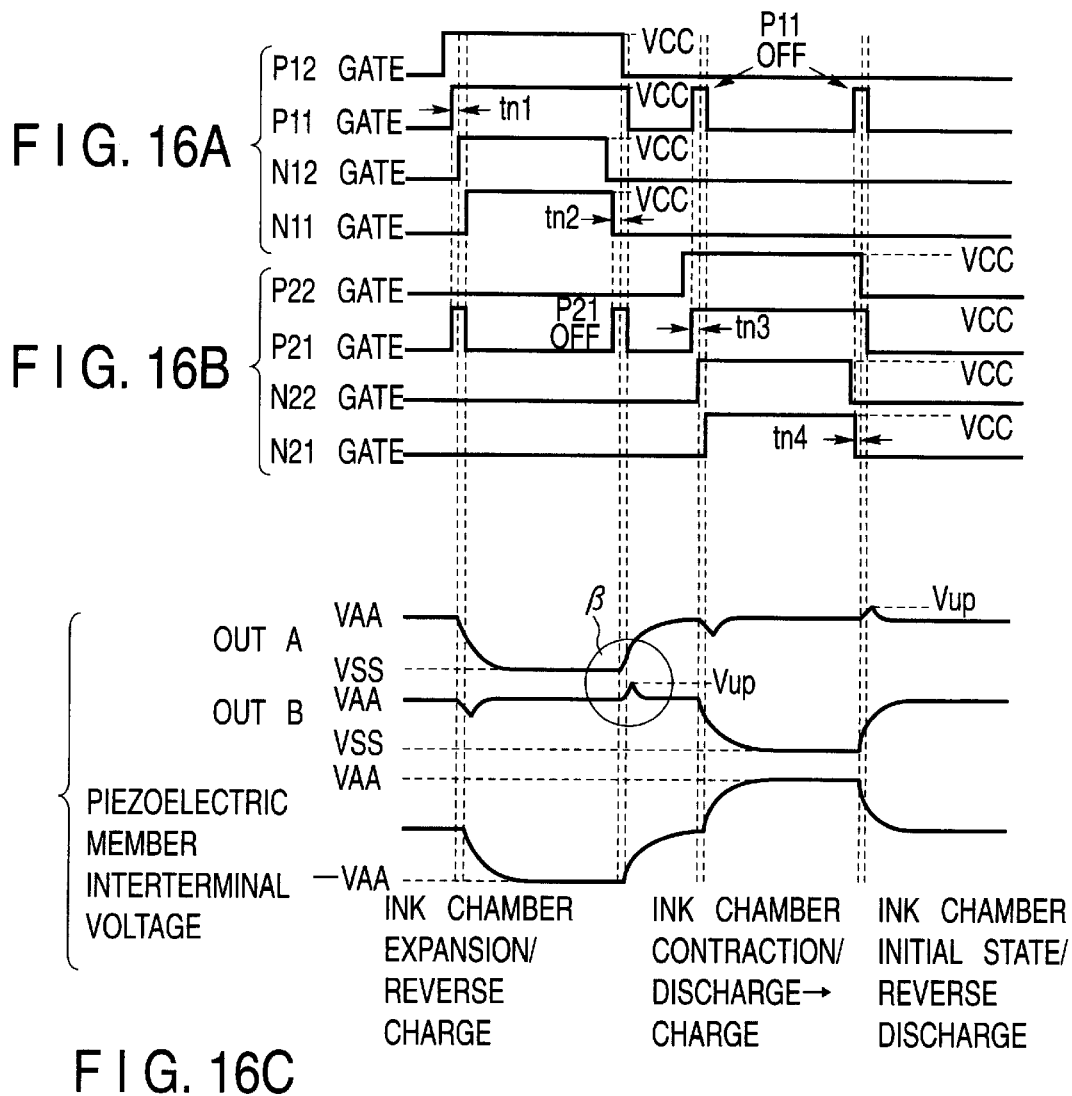
F I G. 16A
F I G. 16B
F I G. 16C
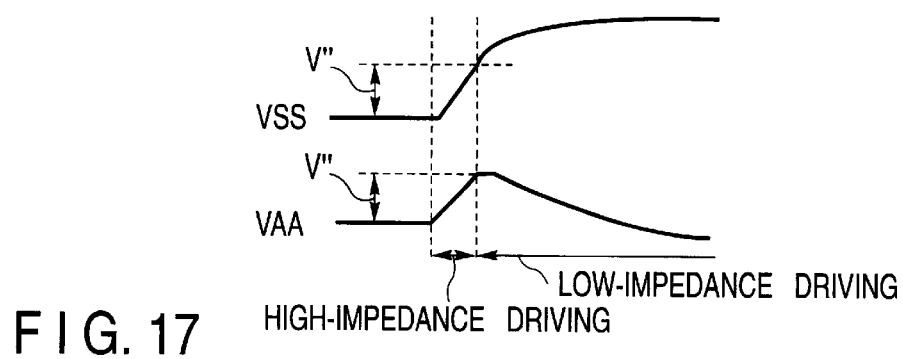
F I G. 17

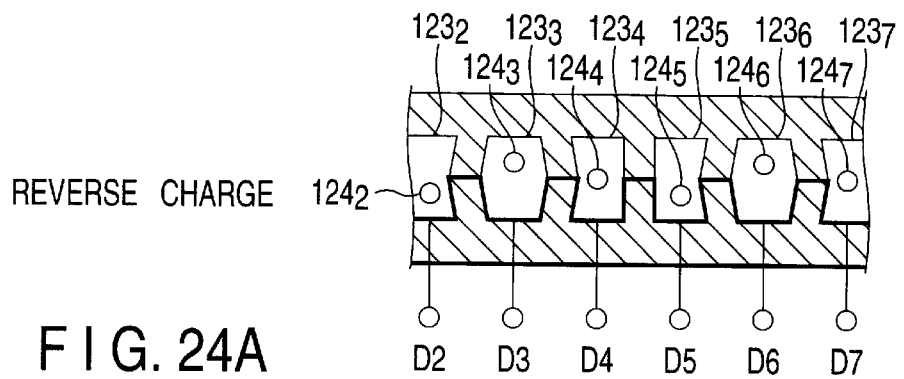
FIG. 24A  REVERSE CHARGE
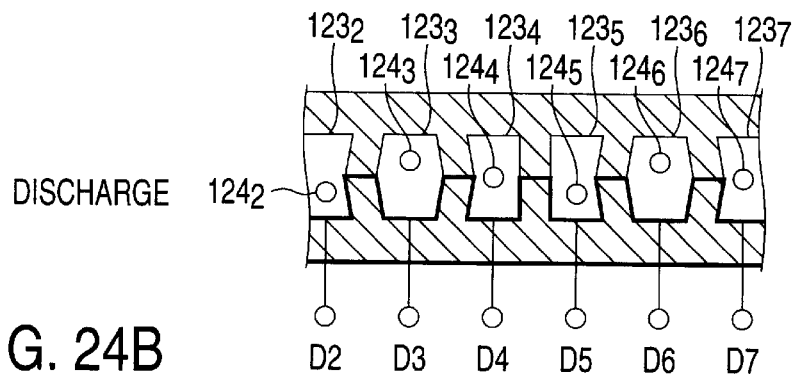
FIG. 24B  DISCHARGE
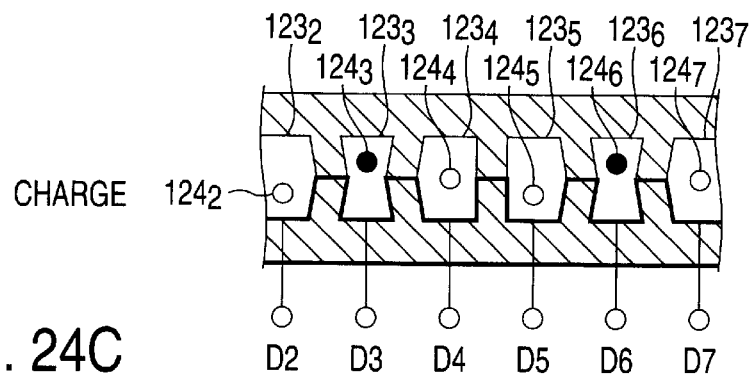
FIG. 24C  CHARGE
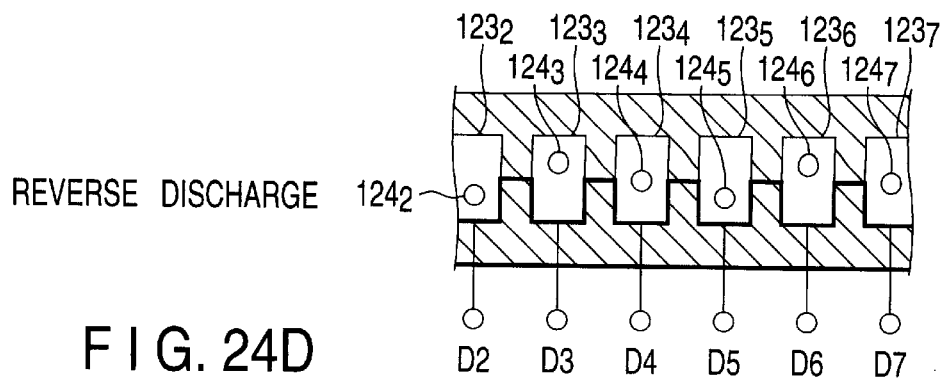
FIG. 24D  REVERSE DISCHARGE

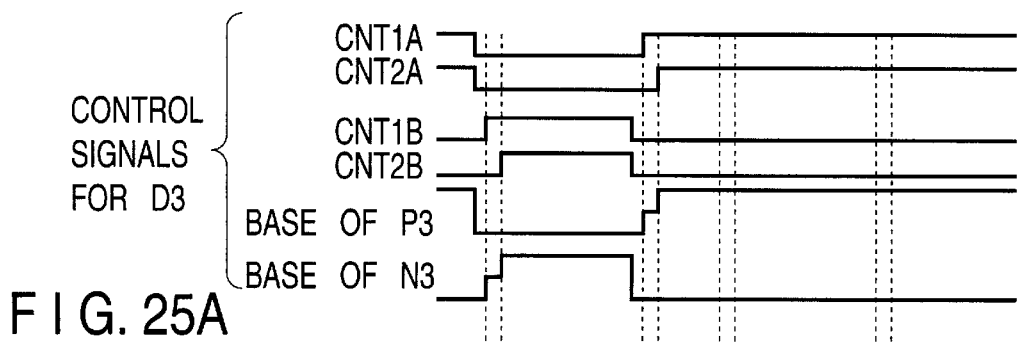
F I G. 25A
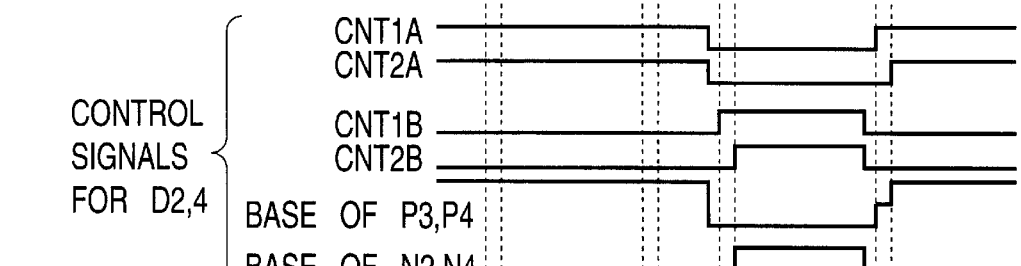
F I G. 25B
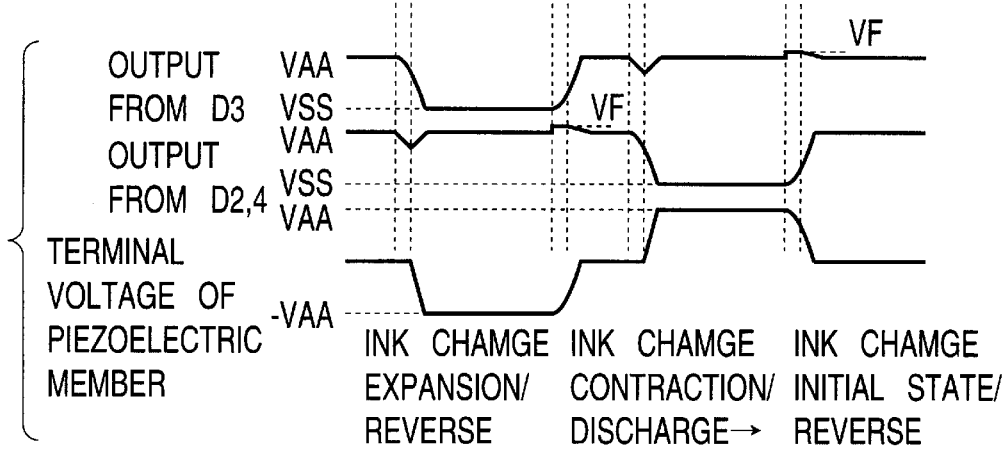
F I G. 25C
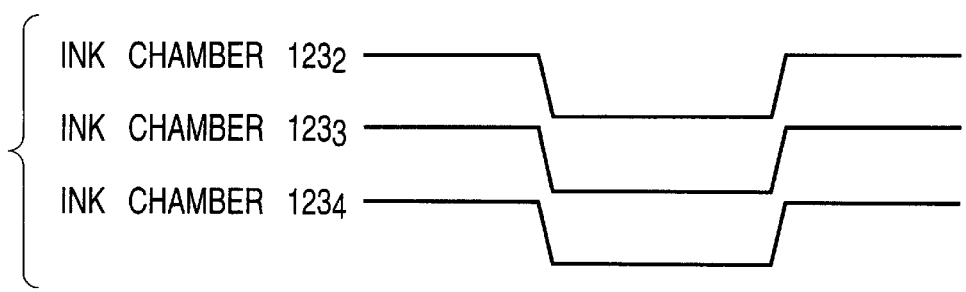
F I G. 26

CAPACITIVE ELEMENT DRIVING APPARATUS

CROSS-REFERENCE TO RELATED APPLICATIONS

This application is based upon and claims the benefit of priority from the prior Japanese Patent Applications No. 11-124582, filed Apr. 30, 1999; and No. 2000-049752, filed Feb. 25, 2000, the entire contents of which are incorporated herein by reference.

BACKGROUND OF THE INVENTION

The present invention relates to a capacitive element driving apparatus for driving a capacitive element such as a piezoelectric member or liquid crystal.

As a capacitive element driving apparatus of this type, a head driving apparatus is disclosed in Jpn. Pat. Appln. KOKAI Publication No. 7-178898, which drives an ink-jet head formed by arraying a plurality of ink chambers with electrodes being connected to capacitive elements such as piezoelectric members. This head driving apparatus drives a share-mode ink-jet head 3 constructed by partitioning ink chambers $1_1$, $1_2$, . . . by piezoelectric members $2_1$, $2_2$, . . . , as shown in FIG. 27. FIG. 28 shows a conventional head driving apparatus 4 for driving the ink-jet head 3.

This head driving apparatus 4 has a serial/parallel converter 5. Outputs from the serial/parallel converter 5 are connected to driving circuits 8 through AND gates 6 and exclusive OR gates 7, respectively. Outputs from the driving circuits 8 are connected to the electrodes of the piezoelectric members $2_1$, $2_2$, . . . provided on the partition walls of the ink chambers $1_1$, $1_2$, . . . through output terminals 9, respectively.

Each driving circuit 8 comprises an input terminal I1, output terminal 9, driving power supply 12, resistors R1 to R5, and bipolar transistors Tr1 to Tr4, as shown in FIG. 29. In this driving circuit 8, when a signal input to the input terminal I1 goes high, the bipolar transistor Tr1 is turned on to output a driving power supply voltage to the output terminal 9. When the input signal goes low, the bipolar transistor Tr2 is turned on to set the output terminal 9 to ground potential.

To control driving the ink-jet head 3 using the driving circuit 8, e.g., to drive an ink chamber $1_3$ and cause it to eject ink, a driving waveform that applies a positive voltage to the ink chamber $1_3$ with respect to the adjacent ink chambers $1_2$ and $1_4$ is applied to the piezoelectric members forming the partition walls between the ink chamber $1_3$ and the ink chambers $1_2$ and $1_4$ for a period Ta to expand the ink chamber $1_3$, as shown in FIG. 30. After that, a driving waveform that applies a positive voltage to the adjacent ink chambers $1_2$ and $1_4$ with respect to the ink chamber $1_3$ is applied for a period Tb to contract the ink chamber $1_3$. When this driving waveform is applied, the interterminal voltage applied to both surfaces of the piezoelectric members that form the partition walls on both sides of the ink chamber $1_3$ abruptly changes from +V to −V, as shown in FIG. 31, so ink is ejected from the ink ejection port of the ink chamber $1_3$.

In this head driving apparatus, to inhibit ink ejection from an ink chamber $1_6$, identical driving waveforms are applied to the ink chamber $1_6$ and ink chambers $1_5$ and $1_7$ adjacent to the ink chamber $1_6$ for the period Tb not to generate a potential difference between the terminals of the piezoelectric members that form the partition walls on both sides of the ink chamber $1_6$, as shown in FIG. 30.

Generally, in a circuit using a bipolar transistor, a MOS (Metal Oxide Semiconductor) transistor is used in place of the bipolar transistor to reduce power consumption. The driving circuit 8 shown in FIG. 29 may also use MOS transistors instead of the bipolar transistors Tr.

However, a driving circuit constructed using PMOS and NMOS transistors in place of the bipolar transistors probably suffers the following problem.

As in the above-described conventional driving circuit, assume that a driving voltage is applied to the piezoelectric members of partition walls on both sides of an ink chamber to be driven to cause it to eject ink from the ink ejection port. When a MOS transistor (low impedance) is turned on, small capacitance components including the junction capacitance of the low-impedance element, the stray capacitance of the driving circuit, and the capacitance of the protective diode are charged/discharged independently of the piezoelectric member as a load.

At this time, since the two electrodes of the piezoelectric member change in the same direction, the piezoelectric member does not act as a load capacitance. Hence, the output voltage steeply changes, and a current with a large peak value and steep leading edge flows. After that, a current corresponding to the charge/discharge of the piezoelectric member flows to the driving circuit and load. Such a current with a large peak value and steep leading edge rises in a sufficiently shorter time than the charge/discharge time of the load.

However, since the charge/discharge time is important for the operation of the piezoelectric member, the short rise time of the first current as described above does not affect the operation of the piezoelectric member. More specifically, the first current with the steep leading edge as described above is wasted by resistive components including the driving circuit, wiring of the head, and the parasitic element of the MOS transistor, and the temperature of the driving elements and head excessively increases.

In addition, the steep current having a large peak value operates the parasitic element of the MOS transistor. This may deteriorate the reliability of the driving element.

The steep change in output voltage also adversely affects a pre-buffer or logic circuit for driving the output element through electrostatic coupling caused by the stray capacitance or the line, resulting in high possibility of operation error.

Even in use of the bipolar transistors Tr, as shown in FIG. 29, when a pulse that goes high during the period Tb, as shown in FIG. 30, is applied to not only ink chambers around an ink chamber to be driven but also all ink chambers that do not eject ink such that no potential difference is generated between the two electrodes of the piezoelectric member, the piezoelectric member (load) is not charged/discharged. Instead, the above-described small capacitance components including the stray capacitance of the driving circuit are charged/discharged in the low-impedance transistor.

More specifically, a current having a small time constant and steep leading and trailing edges (large change in di/dt) flows to the head driving circuit. A large voltage variation of L×di/dt is generated by the inductance component of the wiring of the head driving circuit to result in noise. The output voltage rapidly switches accordingly, radiation noise also increases, and an operation error readily occurs.

BRIEF SUMMARY OF THE INVENTION

It is an object of the present invention to provide a reliable and more inexpensive capacitive element driving apparatus having low power consumption, which is capable of suppressing a peak current in charging/discharging small capacitance components present in a circuit or an element independently of a load, and the gradient of an induction voltage generated in an output on the other side to prevent an operation error and noise due to the change in voltage and current, and also suppressing heat generation in the load and driving circuit.

According to an aspect of the present invention, there is provided a capacitive element driving apparatus comprising:

a transducer forming a capacitive load;

electrode potential control means for variably controlling potentials of two electrodes of an electrostatic capacitive element of the transducer; and impedance control means for, when potentials of the electrodes of the electrostatic capacitive element start changing under the control of the electrode potential control means, controlling an impedance of the electrode potential control means to a high impedance, and while a portion between the electrodes of the electrostatic capacitive element is being charged or discharged, controlling the impedance of the electrode potential control means to a low impedance lower than the high impedance.

According to the present invention, the potentials to be applied to the electrodes of the load are controlled at a high impedance (H) to charge/discharge small capacitance components present in the circuit and elements independently of the load such as a piezoelectric member. After that, the potentials to be applied to the electrodes of the load are controlled at a low impedance (L) to charge/discharge the load such as a piezoelectric member itself. With this operation, the peak current generated in charging/discharging the small capacitance components or the gradient of the leading and trailing edges of the induced voltage generated in the output for controlling the other electrode of the load can be suppressed, and an operation error and noise due to the change in the voltage and current can be prevented. In addition, since heat generation (power consumption) in the load or driving circuit can be suppressed, a highly reliable capacitive element driving apparatus with low power consumption can be provided.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block diagram showing the arrangement of a Kaiser-type ink-jet head driving apparatus according to the first embodiment of the present invention;

FIGS. 3A to 3D are sectional views showing operative states of the Kaiser-type ink-jet head according to the first embodiment;

FIGS. 6A to 6C are timing charts showing the operation timing and application voltage waveforms of the circuit shown in FIG. 5;

FIG. 7 is a block diagram showing the arrangement of a Kaiser-type ink-jet head driving apparatus according to the second embodiment of the present invention;

FIG. 8 is a circuit diagram showing details of the circuit arrangement shown in FIG. 7;

FIGS. 9A to 9C are timing charts showing the operation timing and application voltage waveforms of the circuit shown in FIG. 8;

FIG. 10 is a partial enlarged view of a portion α shown in FIG. 9C;

FIG. 11 is a circuit diagram showing a modification to the detailed arrangement of the circuit shown in FIG. 7;

FIG. 12 is a block diagram showing the detailed circuit arrangement of a Kaiser-type ink-jet head driving apparatus according to the third embodiment of the present invention;

FIGS. 13A to 13C are timing charts showing the operation timing and application voltage waveforms of the circuit shown in FIG. 15;

FIG. 14 is a block diagram showing the arrangement of a Kaiser-type ink-jet head driving apparatus according to the fourth embodiment of the present invention;

FIGS. 16A to 16C are timing charts showing the operation timing and application voltage waveforms of the circuit shown in FIG. 15;

FIG. 17 is a partial enlarged view of a portion β shown in FIG. 16C;

FIGS. 24A to 24D are partial sectional views showing the operative states of the head in driving the ink-jet head of the sixth embodiment in units of three divisions;

FIGS. 25A to 25C are timing charts showing the operation timing and application voltage waveforms when the circuit shown in FIG. 20 is driven and controlled by the control circuit shown in FIG. 22;

FIG. 26 is a timing chart showing voltage waveforms applied to an ink chamber which does not eject ink and adjacent ink chambers on both sides of the ink chamber;

DETAILED DESCRIPTION OF THE INVENTION

Figure 2:
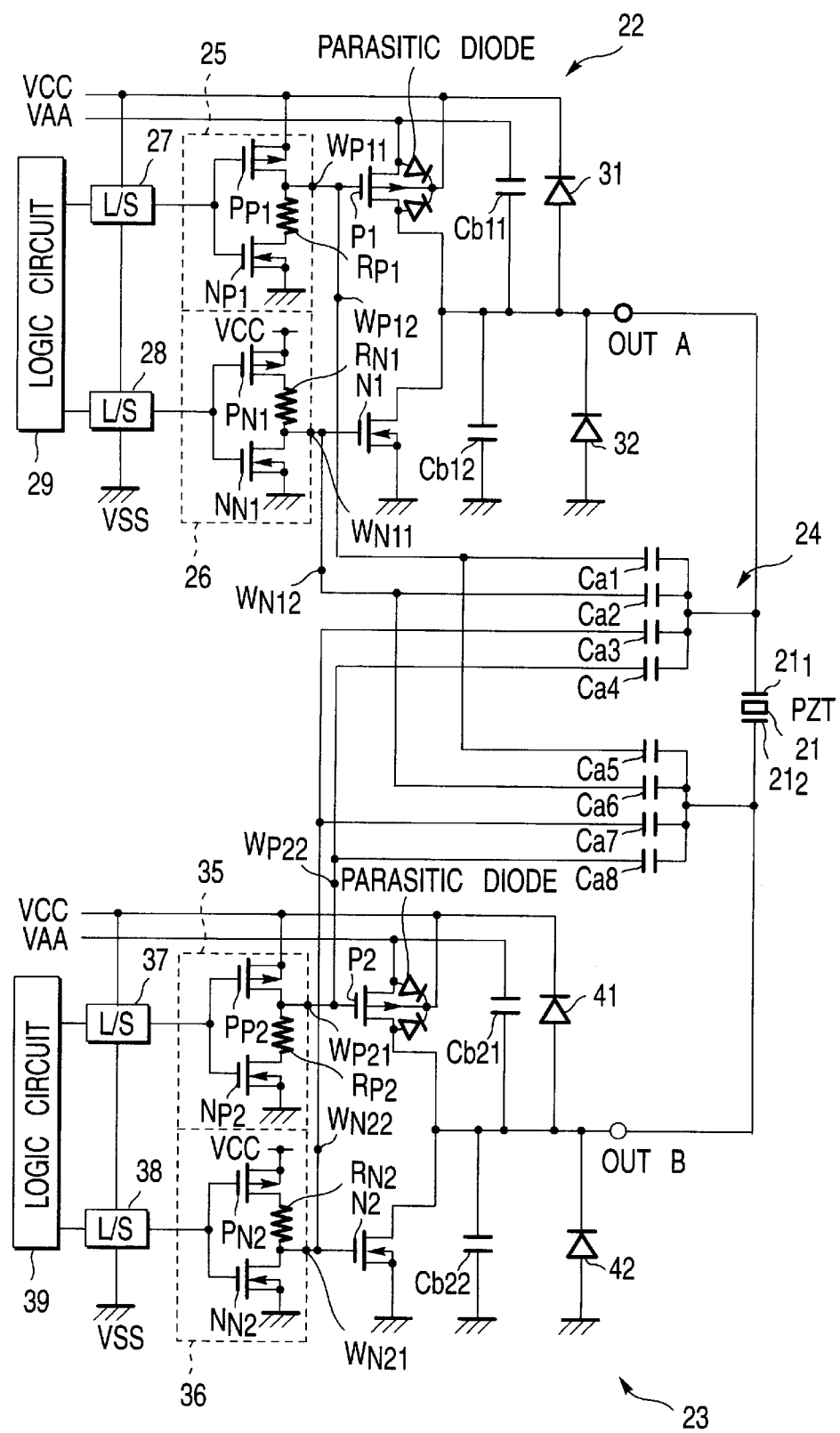
FIG. 2 is a circuit diagram showing details of the circuit arrangement shown in FIG. 1.

The first embodiment in which a capacitive element driving apparatus of the present invention is applied to a Kaiser-type ink-jet head driving apparatus using a piezoelectric member will be described below with reference to FIGS. 1 to 6C.

FIG. 1 is a circuit block diagram showing the arrangement of the apparatus according to the first embodiment. This circuit drives one ink chamber of a Kaiser-type ink-jet head shown in FIGS. 3A to 3D.

This driving circuit comprises an A output circuit 22 and B output circuit 23 serving as electrode potential control means connected to two electrodes $21_1$ and $21_2$ of a piezoelectric member (PZT) 21 as the electrostatic capacitive element of a transducer forming a capacitive load for driving one ink chamber, and a same-direction detection circuit 24 connected to output terminals OUTA and OUTB of the output circuits 22 and 23.

The same-direction detection circuit 24 is constructed by connecting differentiating circuits to the outputs of the output circuits 22 and 23. The sum of outputs from the differentiating circuits (output from the same-direction detection circuit 24) is fed back to the output circuits 22 and 23 to serve as an impedance control means.

More specifically, when both of the electrodes $21_1$ and $21_2$ of the piezoelectric member 21 are changing in the positive direction, the same-direction detection circuit 24 outputs a positive differential waveform. When the electrodes are changing in the negative direction, the same-direction detection circuit 24 outputs a negative differential waveform. On the basis of the positive and negative differential waveforms, Control is performed to make the impedance of the output circuits 22 and 23 high.

FIG. 2 is a circuit diagram showing details of the circuit arrangement shown in the circuit block diagram of FIG. 1. The A output circuit 22 is constructed as follows. PMOS transistor $P_1$ as a switching element and a small capacitor (the junction capacitance of the element, the capacitance of the protective diode, the stray capacitance, etc.) $C_{b11}$ are connected in parallel between a driving voltage VAA and the output terminal OUTA connected to one electrode $21_1$ of the piezoelectric member 21. An NMOS transistor $N_1$ and small capacitor (the junction capacitance of the element, the capacitance of the protective diode, the stray capacitance, etc.) $C_{b12}$ are connected in parallel between the output terminal OUTA and a ground voltage VSS.

The PMOS transistor $P_1$ has a drain, source, and gate fixed on a substrate. The substrate potential is set at a high voltage VCC higher than the driving voltage VAA. This setting prevents a current flowing to the parasitic diode of the PMOS transistor $P_1$ when it is set at a potential higher than the driving voltage VAA by a change in the output OUTB from the B output circuit 23 on the other side. However, the substrate potential need not particularly be set at a different potential as far as the reliability of the element can be maintained even when a current flows to the parasitic diode of the PMOS transistor $P_1$. The substrate potential of the PMOS transistor $P_1$ may be set at the driving voltage VAA. The NMOS transistor $N_1$ has a drain, source, and gate fixed on a substrate. The substrate potential is set at the ground voltage VSS.

The gates of the PMOS transistor $P_1$ and NMOS transistor $N_1$ are connected to output terminals $W_{P11}$ and $W_{N11}$ of prebuffers 25 and 26, respectively. The PMOS transistor $P_1$ and NMOS transistor $N_1$ are driven by outputs from the prebuffers 25 and 26, respectively.

The prebuffers 25 and 26 are driven by switch control signals from a logic circuit 29, which are voltage-converted by level shifters (L/S) 27 and 28, respectively.

The prebuffer 25 is constructed by connecting a PMOS transistor $P_{P1}$ and NMOS transistor $N_{P1}$ in series between the high voltage VCC and the ground voltage VSS. The prebuffer 26 is constructed by connecting a PMOS transistor $P_{N1}$ and NMOS transistor $N_{N1}$ in series between the high voltage VCC and the ground voltage VSS.

A protective diode 31 having polarities shown in FIG. 2 is connected between the output terminal OUTA and the high voltage VCC. A protective diode 32 having polarities shown in FIG. 2 is connected between the output terminal OUTA and the ground voltage VSS.

The B output circuit 23 comprises a PMOS transistor $P_2$, an NMOS transistor $N_2$, a prebuffer 35 constructed by a PMOS transistor $P_{P2}$ and NMOS transistor $N_{P2}$, a prebuffer 36 constructed by a PMOS transistor $P_{N2}$ and NMOS transistor $N_{N2}$, level shifters (L/S) 37 and 38, a logic circuit 39, and protective diodes 41 and 42. The arrangement is the same as that of the A output circuit 22.

The same-direction detection circuit 24 comprises resistors $R_{P1}$ and $R_{N1}$ provided in the prebuffers 25 and 26 of the A output circuit 22, respectively, resistors $R_{P2}$ and $R_{N2}$ provided in the prebuffers 35 and 36 of the B output circuit 23, respectively, and capacitors $C_{a1}$ to $C_{a8}$.

An output $W_{P12}$ from a differentiating circuit formed from the capacitors $C_{a1}$ and $C_{a5}$ and resistor $R_{P1}$ is supplied to the gate of the PMOS transistor $P_1$ of the A output circuit 22. An output $W_{N12}$ from a differentiating circuit formed from the capacitors $C_{a2}$ and $C_{a6}$ and resistor $R_{N1}$ is supplied to the gate of the NMOS transistor $N_1$ of the A output circuit 22.

An Output $W_{P22}$ from a differentiating circuit formed from the capacitors $C_{a4}$ and $C_{a8}$ and resistor $R_{P2}$ is supplied to the gate of the PMOS transistor $P_2$ of the B output circuit 23. An Output $W_{N22}$ from a differentiating circuit formed from the capacitors $C_{a3}$ and $C_{a7}$ and resistor $R_{N2}$ is supplied to the gate of the NMOS transistor $N_2$ of the B output circuit 23.

As described above, the piezoelectric member 21 arranged in correspondence with one ink chamber of the Kaiser-type ink-jet head is driven by the driving circuit having four switching elements.

In the Kaiser-type ink-jet head, the upper plate of an ink chamber 51 is formed from an elastic plate 52, as shown in FIGS. 3A to 3D. The piezoelectric member 21 having the electrodes $21_1$ and $21_2$ on both surfaces, which is driven by the head driving apparatus, is mounted on the upper surface. The elastic plate 52 is deflected upward by the piezoelectric member 21 to expand the ink chamber 51 and draw ink from an ink supply port 55. In this state, the elastic plate 52 is quickly deflected downward to contract the ink chamber 51 whereby ink is ejected from an ink ejection port 56.

The operation principle of the Kaiser-type ink-jet head will be described with reference to the interterminal driving waveform of the piezoelectric member shown in FIG. 4C.

In the initial state, the output terminals OUTA and OUTB of the output circuits 22 and 23 are fixed at the driving voltage, so they have no potential difference. To drive an ink chamber, first, the output OUTA from the A output circuit 22 is dropped to the ground voltage VSS. Since the piezoelectric member 21 is polarized in advance in a direction in which the ink chamber 51 expands, the ink chamber 51 expands (reverse charged state shown in FIG. 3B).

This state is kept for a certain time. The output OUTA from the A output circuit 22 is returned to the driving voltage VAA. Subsequently, the output OUTB from the B output circuit 23 is dropped to the ground voltage VSS (discharged state shown in FIG. 3C to the charged state). When this operation is performed at a high speed, the ink chamber 51 which is expanding rapidly contracts. At this time, ink ejection starts.

After this state is held for a certain time, the output OUTB from the B output circuit 23 is switched to the driving voltage VAA and returned to the initial state (reverse discharged state shown in FIG. 3D to the initial state), and the series of ink ejection operations are ended.

The operation of the driving circuit in driving the ink chamber will be described below with reference to FIGS. 3A to 4C.

In the initial state, since the PMOS transistors $P_1$ and $P_2$ in the output circuits 22 and 23 are ON, the outputs OUTA and OUTB are at the driving voltage VAA. After the PMOS transistor $P_1$ of the A output circuit 22 is turned off, the NMOS transistor $N_1$ is turned on after a time (tk1) for preventing the through current of the output circuit.

At this time, small capacitance components (capacitors $C_{b11}$ and $C_{b12}$) including the junction capacitance of each switching element, the capacitances of the protective diodes 31 and 32, and the stray capacitance in the circuit are charged. The outputs OUTA and OUTB from the output circuits 22 and 23 simultaneously change in the negative direction.

Figure 4A:
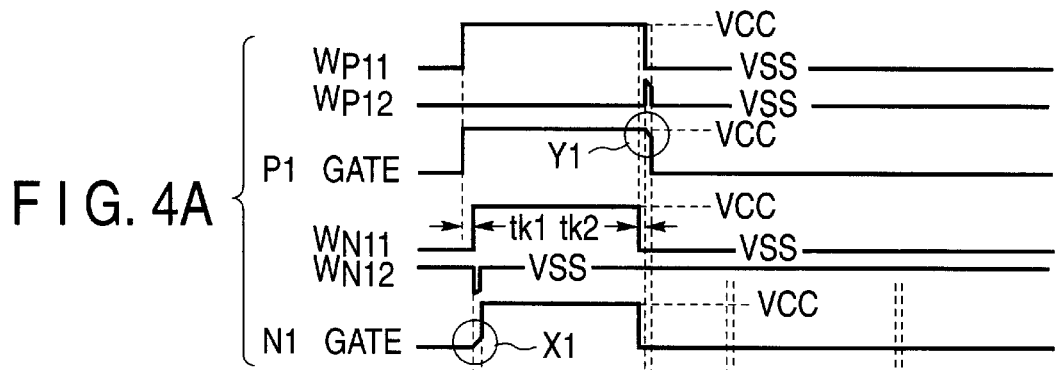
FIGS. 4A to 4C are timing charts showing the operation timing and application voltage waveforms of the circuit shown in FIG. 2.
Figure 4B:
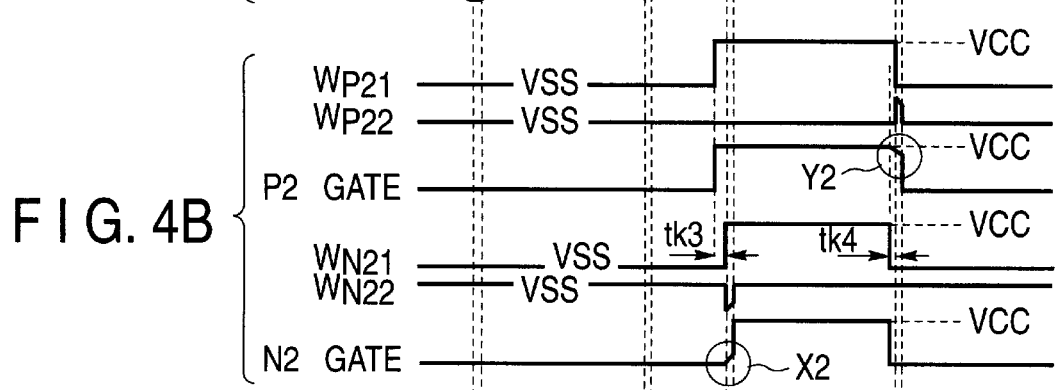
Figure 4C:
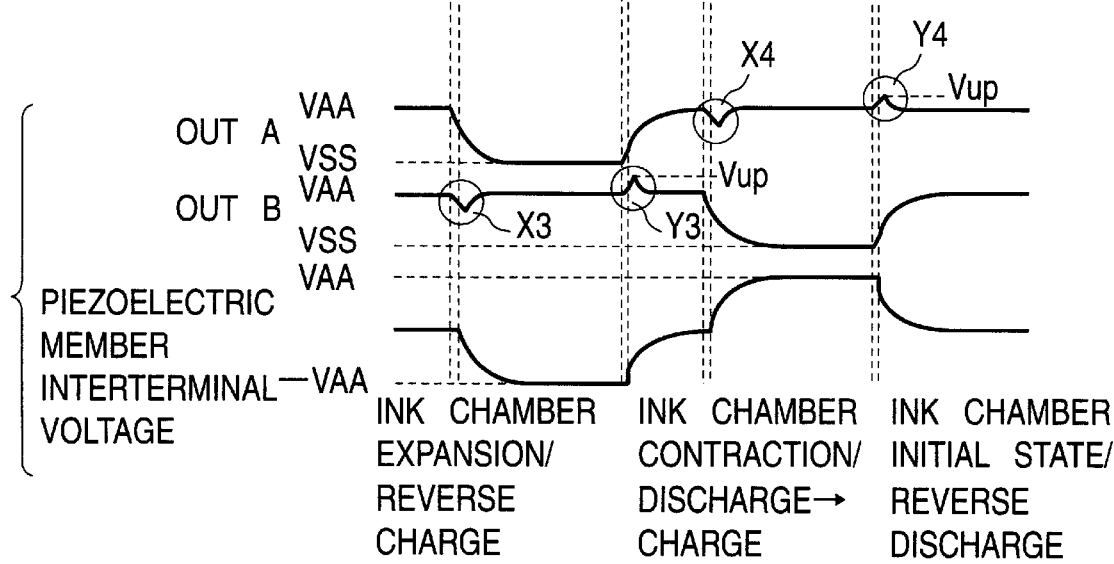

While the outputs OUTA and OUTB from the output circuits 22 and 23 are simultaneously changing in the negative direction, the output $W_{N12}$ from the differentiating circuit formed from the capacitors $C_{a2}$ and $C_{a6}$ and the resistor $R_{N1}$ of the A output circuit 22 has a differential waveform that changes in the negative direction, as shown in FIGS. 4A and 4C.

The output $W_{N11}$ from the prebuffer 26 steeply changes to the high voltage VCC, as shown in FIG. 4A. The synthesized waveform of the output $W_{N11}$ from the prebuffer 26 and the output $W_{N12}$ from the differentiating circuit corresponds to the waveform of the gate voltage of the NMOS transistor $N_1$.

Hence, while the outputs OUTA and OUTB from the output circuits 22 and 23 are simultaneously changing, the differential waveform as the output $W_{N12}$ from the differentiating circuit functions to drive the transistor with a high impedance while suppressing the gate voltage (portion X1 in FIG. 4A). After that, the gate voltage is deeply biased by the output $W_{N11}$ from the prebuffer 26 to drive the transistor with a low impedance lower than the high impedance.

This state is held for a certain time. After the NMOS transistor $N_1$ of the A output circuit 22 is turned off, the PMOS transistor $P_1$ is turned on after a time (tk2) for preventing the through current of the output circuit.

At this time, the above-described small capacitance components (capacitors $C_{b11}$ and $C_{b12}$) are discharged, and the outputs OUTA and OUTB from the output circuits 22 and 23 simultaneously change in the positive direction. While the outputs OUTA and OUTB from the output circuits 22 and 23 are simultaneously changing in the positive direction, the output $W_{P12}$ from the differentiating circuit formed from the capacitors $C_{a1}$ and $C_{a5}$ and the resistor $R_{P1}$ of the A output circuit 22 has a differential waveform that changes in the positive direction, as shown in FIGS. 4A and 4C.

The output $W_{P11}$ from the prebuffer 25 abruptly changes to the ground voltage VSS, as shown in FIG. 4A. The synthesized waveform of the output $W_{P11}$ from the prebuffer 25 and the output $W_{P12}$ from the differentiating circuit corresponds to the waveform of the gate voltage of the PMOS transistor $P_1$.

Hence, while the outputs OUTA and OUTB from the output circuits 22 and 23 are simultaneously changing, the differential waveform as the output $W_{P12}$ from the differentiating circuit functions to drive the transistor with a high impedance while suppressing the gate voltage (portion Y1 in FIG. 4A). After that, the gate voltage is deeply biased by the output $W_{P11}$ from the prebuffer 25 to drive the transistor with a low impedance.

When the output OUTA from the A output circuit 22 rises to some extent, and the discharge operation is almost ended, the PMOS transistor $P_2$ of the B output circuit 23 is turned off. After a time (tk3) for preventing the through current of the output circuit, the NMOS transistor $N_2$ is turned on.

At this time, small capacitance components (capacitors $C_{b21}$ and $C_{b22}$) including the junction capacitance of each switching element, the capacitances of the protective diodes 41 and 42, and the stray capacitance in the circuit are charged. The outputs OUTA and OUTB from the output circuits 22 and 23 simultaneously change in the negative direction.

While the outputs OUTA and OUTB from the output circuits 22 and 23 are simultaneously changing in the negative direction, the output $W_{N22}$ from the differentiating circuit formed from the capacitors $C_{a3}$ and $C_{a7}$ and the resistor $R_{N2}$ of the B output circuit 23 has a differential waveform that changes in the negative direction, as shown in FIGS. 4B and 4C.

The output $W_{N21}$ from the prebuffer 36 abruptly changes to the high voltage VCC, as shown in FIG. 4B. The synthesized waveform of the output $W_{N21}$ from the prebuffer 36 and the output $W_{N22}$ from the differentiating circuit corresponds to the waveform of the gate voltage of the NMOS transistor $N_2$.

Hence, while the outputs OUTA and OUTB from the output circuits 22 and 23 are simultaneously changing, the differential waveform as the output $W_{N22}$ from the differentiating circuit functions to drive the transistor with a high impedance while suppressing the gate voltage (portion X2 in FIG. 4B). After that, the gate voltage is deeply biased by the output $W_{N21}$ from the prebuffer 36 to drive the transistor with a low impedance.

With the series of operations, the electrodes $21_1$ and $21_2$ of the piezoelectric member (PZT) 21 receive the voltage change from −VAA to VAA, as shown in FIG. 4C. The ink chamber 51 rapidly changes from the expanding state shown in FIG. 3B to the contracting state shown in FIG. 3D, and ink ejection starts.

After the contracting state of the ink chamber 51 is held for a certain time, the NMOS transistor $N_2$ of the B output circuit 23 is turned off. After a time (tk4) for preventing the through current of the output circuit, the PMOS transistor $P_2$ is turned on.

At this time, the above-described small capacitance components (capacitors $C_{b21}$ and $C_{b22}$) are discharged, and the outputs OUTA and OUTB from the output circuits 22 and 23 simultaneously change in the positive direction. While the outputs OUTA and OUTB from the output circuits 22 and 23 are simultaneously changing in the positive direction, the output $W_{P22}$ from the differentiating circuit formed from the capacitors $C_{a4}$ and $C_{a8}$ and the resistor $R_{P2}$ of the B output circuit has a differential waveform that changes in the positive direction, as shown in FIGS. 4B and 4C.

The output $W_{P21}$ from the prebuffer 35 abruptly changes to the ground voltage VSS, as shown in FIG. 4B. The synthesized waveform of the output $W_{P21}$ from the prebuffer 35 and the output $W_{P22}$ from the differentiating circuit corresponds to the waveform of the gate voltage of the PMOS transistor $P_2$.

Hence, while the outputs OUTA and OUTB from the output circuits 22 and 23 are simultaneously changing, the differential waveform as the output $W_{P22}$ from the differentiating circuit functions to drive the transistor with a high impedance while suppressing the gate voltage (portion Y2 in FIG. 4B). After that, the gate voltage is deeply biased by the output $W_{P21}$ from the prebuffer 35 to drive the transistor at a low impedance.

The outputs OUTA and OUTB from the output circuits 22 and 23 are returned to the driving voltage VAA, and the ink chamber 51 is returned to the initial state shown in FIG. 3A, thus completing the series of operations of the driving circuit.

As described above, the differentiating circuits are connected to the outputs OUTA and OUTB from the output circuits 22 and 23, and the output from the same-direction detection circuit 24, which is the sum of outputs from the differentiating circuits, is fed back to the output circuits 22 and 23. Since impedance control is performed to drive the transistor with a high impedance in charging/discharging small capacitance components except the piezoelectric member (PZT) 21 as a load when the outputs OUTA and OUTB from the output circuits 22 and 23 are changing, the peak and gradient of the current flowing at that time can be suppressed, as indicated by X1, X2, Y1, or Y2 in FIGS. 4A and 4B.

Figure 5:
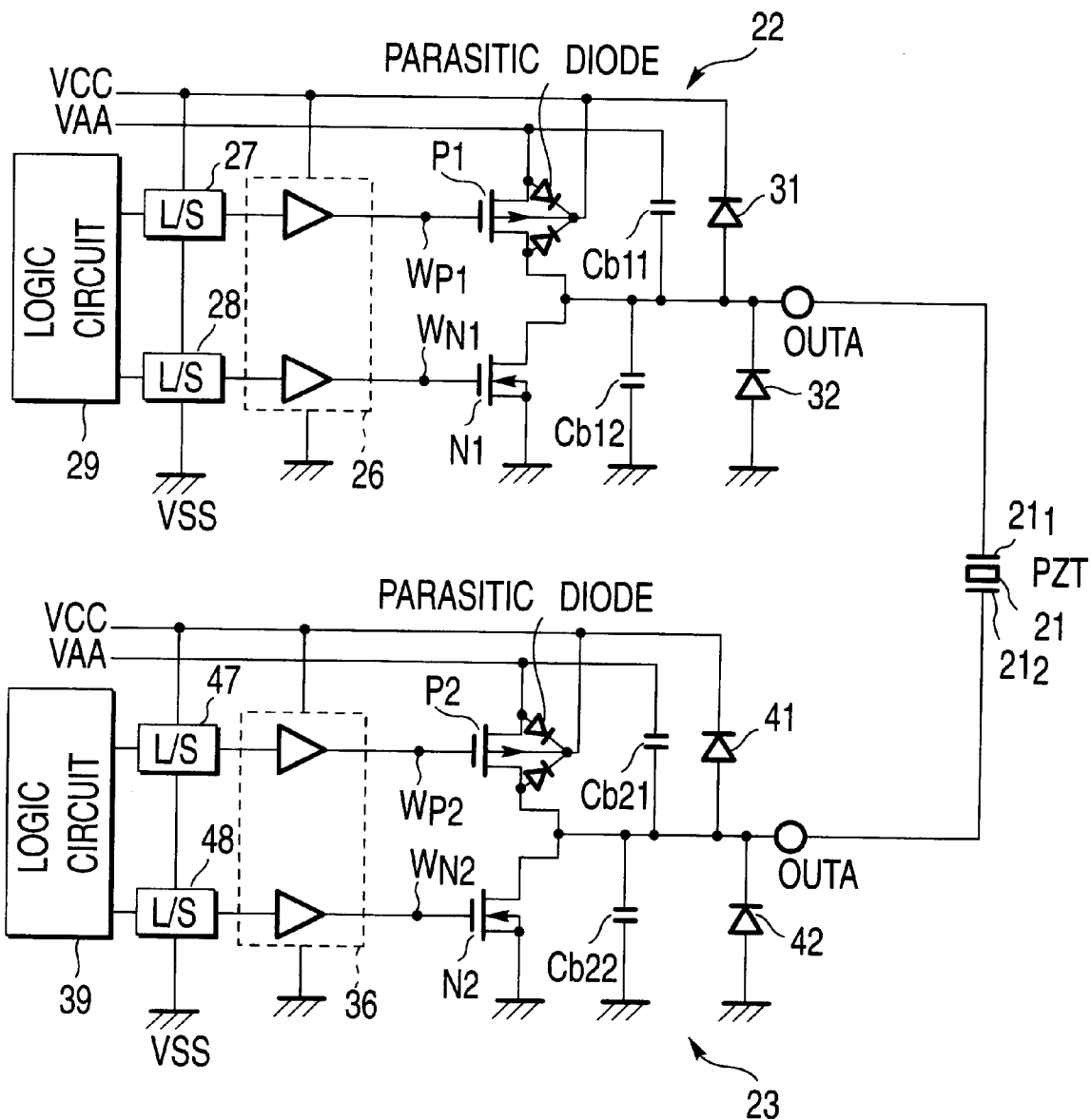
FIG. 5 is a circuit diagram showing the detailed circuit arrangement obtained by removing a same-direction detection circuit in the first embodiment.

When the driving apparatus does not have the same-direction detection circuit 24 of this embodiment, as shown in FIG. 5, the voltages of the outputs OUTA and OUTB from the output circuits 22 and 23 steeply change because of mutual induction of the output voltages, as indicated by portions Z in FIG. 6C. This may flow a current to the parasitic diode of a switching element. If this phenomenon repeatedly occurs, the reliability of the driving circuit itself degrades.

To the contrary, in this embodiment using the same-direction detection circuit 24, when the small capacitance components except the piezoelectric member (PZT) 21 as a load are charged/discharged, the transistor can be driven with a high impedance to suppress the peak and gradient of the current flowing at that time. Hence, changes in voltages of the outputs OUTA and OUTB at that time can be moderated, as indicated by portions X3, X4, Y3, and Y4 in FIG. 4. For this reason, the reliability of the driving circuit can be improved.

The second embodiment in which a capacitive element driving apparatus according to the present invention is applied to a Kaiser-type ink-jet head driving apparatus using a piezoelectric member will be described next with reference to FIGS. 7 to 10. The same reference numerals as in the above-described first embodiment denote the same parts in the second embodiment, and a detailed description thereof will be omitted.

FIG. 7 is a block diagram showing the arrangement of the apparatus of this embodiment. This apparatus drives an ink chamber of a Kaiser-type ink-jet head shown in FIGS. 3A to 3D.

Unlike the circuit shown in FIG. 1, the driving circuit of this embodiment has delay circuits 63 and 64 as impedance control means in place of a same-direction detection circuit 24. By turning on A and B output circuits 61 and 62 as electrode potential control means through the delay circuits 63 and 64, respectively, the output circuits 61 and 62 are driven with a high impedance when outputs OUTA and OUTB from the output circuits 61 and 62 start changing. When the load is to be charged/discharged, the output circuits are driven with a low impedance. That is, this embodiment places an emphasis on a fact that high-impedance driving is required at a timing when the outputs OUTA and OUTB from the output circuits 61 and 62 start changing. When the outputs OUTA and OUTB from the output circuits 61 and 62 start changing, high-impedance driving is performed to charge/discharge small capacitance components except a piezoelectric member 21 as a load. After that, low-impedance driving is performed to charge/discharge the piezoelectric member 21 as a load.

FIG. 8 is a circuit diagram showing details of the circuit arrangement shown in the block diagram of FIG. 7. The A output circuit 61 comprises PMOS transistors $P_{11}$ and $P_{12}$ and NMOS transistors $N_{11}$ and $N_{12}$ which construct an output buffer, a prebuffer 65 formed by series-connecting buffers $P_{P11}$ and $P_{P12}$, a prebuffer 66 formed by series-connecting buffers $P_{N11}$ and $P_{N12}$, level shifters (L/S) 27 and 28, a logic circuit 29, and protective diodes 31 and 32. The arrangement of the A output circuit 61 of this embodiment is almost the same as that of the A output circuit 22 shown in FIG. 2 except that the output buffer is constructed by connecting the two PMOS transistors $P_{11}$ and $P_{12}$ having the same gate size in parallel and the two NMOS transistors $N_{11}$ and $N_{12}$ having the same gate size in parallel.

More specifically, since the gate of the PMOS transistor $P_{12}$ is connected to the output of the buffer $P_{P11}$, the PMOS transistor $P_{12}$ is driven on the basis of the output from the buffer $P_{P11}$. Additionally, the output from the buffer $P_{P11}$ is input to the gate of the PMOS transistor $P_{11}$ through the buffer $P_{P12}$. The PMOS transistor $P_{11}$ is driven on the basis of the output from the buffer $P_{12}$ with a delay from the PMOS transistor $P_{12}$ by the buffer $P_{P12}$. Hence, for the PMOS transistor $P_{11}$, the buffer $P_{12}$ functions as the delay circuit 63 shown in FIG. 7.

Since the gate of the NMOS transistor $N_{12}$ is connected to the output from the buffer $P_{N11}$, the NMOS transistor $N_{12}$ is driven on the basis of the output from the buffer $P_{N11}$. Additionally, the output from the buffer $P_{N11}$ is input to the gate of the NMOS transistor $N_{11}$ through the buffer $P_{N12}$. The NMOS transistor $N_{11}$ is driven on the basis of the output from the buffer $P_{N12}$ with a delay from the NMOS transistor $N_{12}$ by the buffer $P_{N12}$. Hence, for the NMOS transistor $N_{11}$, the buffer $P_{N12}$ functions as the delay circuit 63 shown in FIG. 7.

The B output circuit 62 comprises PMOS transistors $P_{21}$ and $P_{22}$ and NMOS transistors $N_{21}$ and $N_{22}$ which construct an output buffer, a prebuffer 67 formed by series-connecting buffers $P_{P21}$ and $P_{P22}$, a prebuffer 68 formed by series-connecting buffers $P_{N21}$ and $P_{N22}$, level shifters (L/S) 37 and 38, a logic circuit 39, and protective diodes 41 and 42. The arrangement is the same as that of the A output circuit 61.

For the PMOS transistor $P_{21}$, the buffer $P_{P22}$ functions as the delay circuit 64 shown in FIG. 7. For the NMOS transistor $N_{21}$, the buffer $P_{N22}$ functions as the delay circuit 64 shown in FIG. 7.

The substrate potential of the PMOS transistors $P_{11}$, $P_{12}$, $P_{21}$, and $P_{22}$ of the output circuits 61 and 62 is set at a high voltage VCC higher than a driving voltage VAA. When the output exceeds the driving voltage VAA during the switching sequence of these switching elements (portions Z shown in FIG. 6C), a current flow to the parasitic diode of each switching element or the protective diode can be prevented.

The operation of the driving circuit of this embodiment in driving the Kaiser-type ink-jet head shown in FIGS. 3A to 3D will be described below with reference to FIGS. 9A to 9C.

In the initial state, the PMOS transistors $P_{11}$ $P_{12}$, $P_{21}$, and $P_{22}$ are ON, and the outputs OUTA and OUTB from the output circuits 61 and 62 are fixed at the driving voltage and have no potential difference.

When an ink chamber 51 is to be driven, first, a signal for turning off the PMOS transistors $P_{11}$ and $P_{12}$ of the A output circuit 61 is output from the logic circuit 29, voltage-converted by the level shifter (L/S) 27, and input to the first buffer $P_{P11}$ of the prebuffer 65. The output from the buffer $P_{P11}$ drives the gate of the PMOS transistor $P_{12}$ to turn off the PMOS transistor $P_{12}$.

The output from the first buffer $P_{P11}$ is also input to the second buffer $P_{P12}$. The output gate-delayed by the second buffer $P_{12}$ drives the gate of the PMOS transistor $P_{11}$ to turn off the PMOS transistor $P_{11}$.

After a time (tm1) for preventing the through current of the output circuit, a signal for turning on the NMOS transistors $N_{11}$ and $N_{12}$ of the A output circuit 61 is output from the logic circuit 29, voltage-converted by the level shifter (L/S) 28, and input to the first buffer $P_{N11}$ of the prebuffer 66. The output from the buffer $P_{N11}$ drives the gate of the NMOS transistor $N_{12}$ to turn on the NMOS transistor $N_{12}$.

The output from the first buffer $P_{N11}$ is also input to the second buffer $P_{N12}$. The output gate-delayed by the second buffer $P_{N12}$ drives the gate of the NMOS transistor $N_{11}$ to turn on the NMOS transistor $N_{11}$.

The two NMOS transistors $N_{11}$ and $N_{12}$ are parallelly connected, and the NMOS transistors $N_{12}$ and $N_{11}$ are turned on in this order sequentially with a delay by the two buffers $P_{N11}$ and $P_{N12}$ connected in series. Small capacitance components (capacitors $C_{b11}$ and $C_{b12}$) including the junction capacitance of each element, the capacitances of the protective diodes 31 and 32, and the stray capacitance present in the circuit are charged first by only the NMOS transistor $N_{12}$. This moderates the change in the current at that time and also moderates the trailing edge of the output voltage (portion X5 in FIG. 9C).

The peak and change speed of the current that flows through the circuit and load in accordance with the change in output voltage are suppressed. In addition, the fall speed of an induced voltage which appears in the B output circuit 62 and is determined by the voltage division ratio of the resistance when the NMOS transistors $N_{12}$ and $N_{11}$ of the A output circuit 61 are turned on sequentially in this order to the ON resistance of the PMOS transistors $P_{21}$ and $P_{22}$ of the B output circuit 62 is also suppressed (portion X5 in FIG. 9C).

When the output OUTA is switched to ground voltage VSS, the ink chamber 51 corresponding to the piezoelectric member 21 expands (reverse charged state shown in FIG. 3B). This state is kept for a certain time. Next, the NMOS transistors $N_{12}$ and $N_{11}$ of the A output circuit 61 are turned off sequentially in this order in the same manner as described above.

After a time (tm2) for preventing the through current of the output circuit, a signal for turning on the PMOS transistors $P_{11}$ and $P_{12}$ of the A output circuit 61 is output from the logic circuit 29, voltage-converted by the level shifter (L/S) 27, and input to the first buffer $P_{P11}$ of the prebuffer 65. The output from the buffer $P_{P11}$ drives the gate of the PMOS transistor $P_{12}$ to turn on the PMOS transistor $P_{12}$.

The output from the first buffer $P_{P11}$ is also input to the second buffer $P_{P12}$. The output gate-delayed by the second buffer $P_{P12}$ drives the gate of the PMOS transistor $P_{11}$ to turn on the PMOS transistor $P_{11}$.

The two PMOS transistors $P_{11}$ and $P_{12}$ are parallelly connected, and the PMOS transistors $P_{12}$ and $P_{11}$ are turned on in this order sequentially with a delay by the two buffers $P_{P11}$ and $P_{12}$ connected in series. The small capacitance components (capacitors $C_{b11}$ and $C_{b12}$) including the junction capacitance of each element, the capacitances of the protective diodes 31 and 32, and the stray capacitance present in the circuit are discharged first by only the PMOS transistor $P_{12}$. This moderates the change in the current at that time and also moderates the leading edge of the output voltage (portion Y5 in FIG. 9C).

The peak and change speed of the current that flows through the circuit and load in accordance with the change in output voltage are suppressed. In addition, the rise speed of an induced voltage which appears in the B output circuit 62 and is determined by the voltage division ratio of the resistance when the PMOS transistors $P_{12}$ and $P_{11}$ of the A output circuit 61 are turned on sequentially in this order to the ON resistance of the PMOS transistors $P_{21}$ and $P_{22}$ of the B output circuit 62 is also suppressed (portion Y5 in FIG. 9C).

When the output OUTA from the A output circuit 61 rises to some extent, and the discharge operation is almost ended, the PMOS transistors $P_{22}$ and $P_{21}$ of the B output circuit 62 are turned off sequentially in this order in the above-described way. After a time (tm3) for preventing the through current of the output circuit, the NMOS transistors $N_{22}$ and $N_{21}$ are turned on sequentially in this order in the above-described way. with the series of operations, a change corresponding twice the driving voltage (−VAA to VAA) is generated between the electrodes of the piezoelectric member, as shown in FIG. 9C. The ink chamber 51 rapidly changes from the expanding state to the contracting state, and ink ejection from the ink chamber 51 starts.

After this state is held for a certain time, the NMOS transistors $N_{22}$ and $N_{21}$ of the B output circuit 62 are turned off sequentially in this order in the above-described way. After a time (tm4) for preventing the through current of the output circuit, the PMOS transistors $P_{22}$ and $P_{21}$ are turned on sequentially in this order in the above-described way.

At this time as well, since the PMOS transistors $P_{22}$ and $P_{21}$ of the B output circuit 62 are turned on sequentially in this order, the small capacitance components (capacitors $C_{b11}$ and $C_{b12}$) are discharged first by only the PMOS transistor $P_{22}$. This moderates the change in the current at that time and also moderates the leading edge of the output voltage (portion Y6 in FIG. 9C).

The peak and change speed of the current that flows through the circuit and load in accordance with the change in this voltage are suppressed. In addition, the rise speed of an induced voltage which appears in the A output circuit 61 and is determined by the voltage division ratio of the resistance when the PMOS transistors $P_{22}$ and $P_{21}$ of the B output circuit 62 are turned on sequentially in this order to the ON resistance of the PMOS transistors $P_{11}$ and $P_{12}$ of the A output circuit 61 is also suppressed (portion Y6 in FIG. 9C).

With this operation, the two electrodes of the piezoelectric member 21 are set at the equipotential (initial state). The reverse discharged state shown in FIG. 3D is returned to the initial state, and the series of ink ejection operations are ended.

As described above, a pair of switching elements are connected in parallel, and two series-connected buffers are prepared to drive the switching elements sequentially. When the switching elements are to be turned on to change the output, the switching elements are turned on sequentially with a delay. With this arrangement, impedance control can be performed so that when a capacitance (e.g., small capacitance) except for the piezoelectric member 21 as a load present in the driving circuit is to be charged/discharged, only one switching element ($P_{12}$ ($N_{12}$) or $P_{22}$ ($N_{22}$)) is driven to realize high-impedance driving, and when the piezoelectric member 21 as a load is to be charged/discharged, both the switching elements ($P_{12}$ and $P_{11}$ ($N_{12}$ and $N_{11}$) or $P_{22}$ and $P_{21}$ ($N_{22}$ and $N_{21}$)) are driven to realize low-impedance driving.

As in the above-described first embodiment, the changes in the voltage and current in charging/discharging a capacitance other than the load present in the driving circuit can be moderated. That is, the leading and trailing edges can be controlled to be moderate.

Hence, the current at the first rise or fall can be prevented from being wasted by resistive components including the driving circuit, wiring of the head, and the parasitic element of each MOS transistor, and the temperature of the driving elements and head can be prevented from excessively increasing. In addition, when the peak value of the current is suppressed, and the change in the current is moderated, operation of the parasitic element of each MOS transistor can be prevented, and the reliability of the driving element can be improved.

Furthermore, the small capacitance is several pF or less while the load capacitance of the piezoelectric element is several ten to several hundred pF or more. The charge/discharge time of the small capacitance is much shorter than the time in which the load capacitance is discharged and charged to eject ink and does not affect the ejection characteristics.

For example, as shown in FIG. 10, a voltage V' when the voltage moderately changes corresponds to the driving voltage division ratio of the high impedance of the A output circuit 61 on the changing side to the high impedance of the B output circuit 62 affected by the output from the output circuit 61.

In the second embodiment, each switching element is constructed by parallelly connecting MOS transistors having the same gate size. However, the present invention is not limited to this. A high-impedance element having a smaller gate width may be used as a switching element ($P_{12}$ ($N_{12}$) or $P_{22}$ ($N_{22}$)) to be driven first, and a low-impedance element having a sufficiently large gate width may be used as a switching element to be driven later ($P_{11}$ ($N_{11}$) or $P_{21}$ ($N_{21}$)). This arrangement can further moderate the gradient of the induced voltage or current waveform.

FIG. 11 is a circuit diagram showing a modification to the driving circuit of the second embodiment. The same reference numerals as in FIG. 8 denote the same parts in FIG. 11, and a detailed description thereof will be omitted.

The A output circuit 61 of this modification is different from that shown in FIG. 8 in that the substrate potential of the PMOS transistors $P_{11}$ and $P_{12}$ is set equal to the driving voltage VAA. The substrate potential of the PMOS transistors $P_{21}$ and $P_{22}$ of the B output circuit 62 is also set equal to the driving voltage VAA, like the A output circuit 61.

In the circuit shown in FIG. 8, when one of the outputs OUTA and OUTB from the output circuits 61 and 62 starts rising, the other output exceeds the driving voltage VAA because of induction. In this modification, however, even when a current flows to the protective diodes 31 and 41 connected between the driving voltage and the output terminals of the output circuits 61 and 62 or the parasitic diode of each switching element, the current has a moderate leading edge. Even when a parasitic transistor having the parasitic diode as a base is present in the switching element, it does not readily operate, so a reliable driving circuit can be provided.

The third embodiment in which a capacitive element driving apparatus according to the present invention is applied to a Kaiser-type ink-jet head driving apparatus using a piezoelectric member will be described next with reference to FIGS. 12 to 13C. The same reference numerals as in the above-described second embodiment denote the same parts in the third embodiment, and a detailed description thereof will be omitted.

FIG. 12 is a circuit diagram showing the arrangement of part of the apparatus according to this embodiment. This apparatus drives an ink chamber of a Kaiser-type ink-jet head shown in FIGS. 3A to 3D.

An A output circuit 71 of this driving circuit is different from the output circuit shown in FIG. 8 in that an NMOS transistor $N_1$ is connected between an output terminal OUTA and ground voltage VSS, a prebuffer 73 for driving the NMOS transistor $N_1$ at a high voltage VCC is constructed by a PMOS transistor $P_{N1}$, NMOS transistor $N_{N1}$, and diode 74, and the circuit also has a PMOS transistor $P_{5V1}$ for driving the NMOS transistor $N_1$ through the diode 74 at a predetermined voltage (5V) lower than the driving voltage, and a delay circuit (Delay) 75 for delaying the output from the prebuffer 73.

More specifically, the PMOS transistor $P_{N1}$ and NMOS transistor $N_{N1}$ are connected in series between the driving voltage VCC and the ground voltage VSS. The gate of the NMOS transistor $N_1$ is connected to the connection point between the PMOS transistor $P_{N1}$ and the NMOS transistor $N_{N1}$.

The output of a level shifter (L/S) 28 is connected to the gates of the PMOS transistor $P_{N1}$ and NMOS transistor $N_{N1}$. A switch control signal from a logic circuit 29 is input to the input terminal of the level shifter 28 through the delay circuit 75.

A 5-V power supply terminal is connected to the drain of the PMOS transistor $P_{5V1}$. The source of the PMOS transistor $P_{5V1}$ is connected to the gate of the NMOS transistor $N_1$ through the diode 74. The switch control signal from the logic circuit 29 is directly input to the gate of the PMOS transistor $P_{5V1}$.

A B output circuit 72 is different from the output circuit shown in FIG. 8 in that an NMOS transistor $N_2$ is connected between an output terminal OUTB and the ground voltage VSS, and the circuit also has a prebuffer 76 constructed by a PMOS transistor $P_{N2}$, NMOS transistor $N_{N2}$, and diode 77 to drive the NMOS transistor $N_2$ at the high voltage VCC, a PMOS transistor $P_{5V2}$ for driving the NMOS transistor $N_2$ through the diode 77 at a predetermined voltage (5V) lower than the driving voltage, and a delay circuit 78 for delaying the output from the prebuffer 76. The detailed arrangement is the same as that of the A output circuit 71.

The operation of the driving circuit shown in FIG. 12 in driving an ink chamber 51 of the Kaiser-type ink-jet head shown in FIGS. 3A to 3D will be described with reference to FIGS. 13A to 13C. To change the ink chamber 51 from the initial state shown in FIG. 3A to the reverse charged state shown in FIG. 3B, the driving circuit shown in FIG. 8 turns on the NMOS transistors $N_{12}$ and $N_{11}$ in this order with a delay. The A output circuit 71 is different from the circuit shown in FIG. 8 in that the NMOS transistor $N_1$ is driven with 5V and then driven at the high voltage VCC with a delay.

More specifically, to shift the initial state to the reverse charged state, a signal for turning on the PMOS transistor $P_{5V1}$ is output from the logic circuit 29. The PMOS transistor $P_{5V1}$ is turned on, and the NMOS transistor $N_1$ is driven by 5V. At this time, since the gate of the NMOS transistor $N_1$ is not sufficiently biased, the NMOS transistor is turned on at a high impedance.

The switch control signal from the logic circuit 29 is delayed by the delay circuit 75, voltage-converted by the level shifter 28, and input to the gates of the PMOS transistor $P_{N1}$ and NMOS transistor $N_{N1}$ of the prebuffer 73. The PMOS transistor $P_{N1}$ and NMOS transistor $N_{N1}$ driven at the high voltage VCC are turned on to drive the NMOS transistor $N_1$. At this time, since the high voltage VCC is applied to the gate of the NMOS transistor $N_1$, the NMOS transistor $N_1$ is turned on with a low impedance to drive a piezoelectric member 21.

To turn off the NMOS transistor $N_1$, a signal for turning off the PMOS transistor $P_{5V1}$ is output from the logic circuit 29 and input to the gate of the NMOS transistor $N_1$. The switch control signal from the logic circuit 29 is output from the delay circuit 75 with a delay and input to the gate of the NMOS transistor $N_1$ through the level shifter 28 to turn off the NMOS transistor $N_1$. The B output circuit 72 operates in the same way as described above to turn on/off the NMOS transistor $N_2$.

As described above, the gate of the MOS transistor $N_1$ or $N_2$ is driven at a voltage (5V) lower than the driving voltage VAA and then driven at the high voltage VCC. With this operation, impedance control can be performed so that the output from the NMOS transistor $N_1$ or $N_2$ is turned on with a high impedance and then off with a low impedance. Hence, the same effect as that of the above-described second embodiment can be obtained.

In this embodiment, one NMOS transistor $N_1$ or $N_2$ is driven while changing the gate voltage. However, the present invention is not limited to this. Instead of the NMOS transistor $N_1$ or $N_2$, a high-impedance NMOS transistor and low-impedance NMOS transistor may be parallelly connected, as in the second embodiment. The high-impedance NMOS transistor may be driven at a voltage (e.g., 5V) lower than the high voltage VCC, and the low-impedance NMOS transistor may be driven at the high voltage VCC.

In this embodiment, the NMOS transistor $N_1$ or $N_2$ is driven by different power supplies with a delay. This arrangement can also be realized for a PMOS transistor by combining another power supply and the gate driving circuit such that the gates of the PMOS transistors $P_{11}$ and $P_{12}$ or $P_{21}$ and $P_{22}$ at a voltage lower than the high voltage VCC.

First switching may be softened by simply moderating the gate waveform. However, a MOS transistor is driven by the waveform that is moderated from the beginning to the end with a C/R curve. This adversely affects the charge/discharge operation and ink ejection operation. However, the third embodiment is advantageous because the waveform is not moderated to the end with a C/R curve and does not adversely affect the ink ejection operation.

The fourth embodiment in which a capacitive element driving apparatus according to the present invention is applied to a Kaiser-type ink-jet head driving apparatus using a piezoelectric member will be described next with reference to FIGS. 14 to 17. The same reference numerals as in the above-described second embodiment denote the same parts in the fourth embodiment, and a detailed description thereof will be omitted.

FIG. 14 is a partial circuit diagram showing the arrangement of the apparatus according to this embodiment. This apparatus drives an ink chamber of a Kaiser-type ink-jet head shown in FIGS. 3A to 3D. The driving circuit of this embodiment has, in place of the delay circuits 63 and 64 shown in FIG. 7, a signal change detection circuit 83 as an impedance control means for controlling to make the impedance ratio of one output circuit match with that of the other output circuit. Impedance control of output circuits 81 and 82 is performed by this signal change detection circuit 83.

Figure 15:
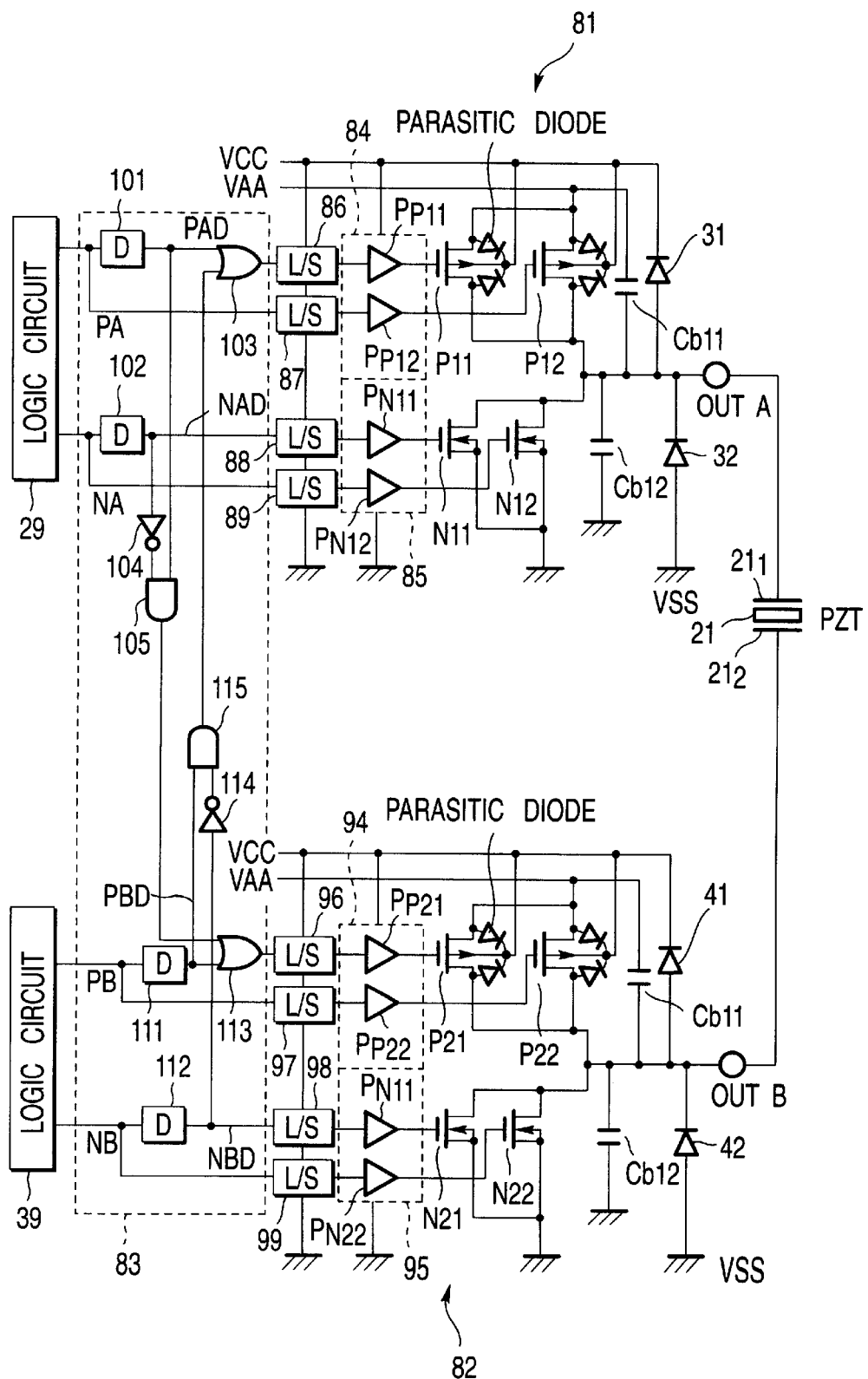
FIG. 15 is a circuit diagram showing details of the circuit arrangement shown in FIG. 14.

FIG. 15 is a circuit diagram showing details of the circuit arrangement shown in the circuit block diagram of FIG. 14. The A output circuit 81 of this driving circuit is different from the output circuit shown in FIG. 8 in that a prebuffer 84 for driving a PMOS transistors $P_{11}$ (low impedance) and $P_{12}$ (high impedance) is constructed by connecting buffers $P_{P11}$ and $P_{12}$ to the gates of the PMOS transistors $P_{11}$ and $P_{12}$, respectively, a prebuffer 85 for driving NMOS transistors $N_{11}$ and $N_{12}$ is constructed by connecting buffers $P_{N11}$ and $P_{N12}$ to the gates of the NMOS transistors $N_{11}$ and $N_{12}$, respectively, and the circuit also has level shifters (L/S) 86 to 89 for separately inputting a switch control signal from a logic circuit 29 to the buffers $P_{P11}$, $P_{P12}$, $P_{N11}$, and $P_{N12}$ of the prebuffers 84 and 85 through the signal change detection circuit 83.

The B output circuit 82 is different from the output circuit shown in FIG. 8 in that a prebuffer 94 for driving PMOS transistors $P_{21}$ and $P_{22}$ is constructed by connecting buffers $P_{P21}$ and $P_{P22}$ to the gates of the PMOS transistors $P_{21}$ and $P_{22}$, respectively, a prebuffer 95 for driving NMOS transistors $N_{21}$ and $N_{22}$ is constructed by connecting buffers $P_{N21}$ and $P_{N22}$ to the gates of the NMOS transistors $N_{21}$ and $N_{22}$, respectively, and the circuit also has level shifters (L/S) 96 to 99 for separately inputting a switch control signal from a logic circuit 39 to the buffers $P_{P21}$, $P_{P22}$, $P_{N21}$, and $P_{N22}$ of the prebuffers 94 and 95 through the signal change detection circuit 83.

The signal change detection circuit 83 comprises delay circuits (D) 101, 102, 111, and 112, OR gates 103 and 113, inverters 104 and 114, and AND gates 105 and 115.

More specifically, the signal change detection circuit 83 inputs switch control signals for driving the PMOS transistors $P_{11}$, $P_{12}$, $P_{21}$, and $P_{22}$ from the logic circuits 29 and 39 to the level shifters 87 and 97, respectively, and also to the level shifters 86 and 96 through the delay circuits 101 and 111 and OR gates 103 and 113, respectively.

The signal change detection circuit 83 also inputs switch control signals for driving the NMOS transistors $N_{11}$, $N_{12}$, $N_{21}$, and $N_{22}$ from the logic circuits 29 and 39 to the level shifters 89 and 99, respectively, and also to the level shifters 88 and 98 through the delay circuits 102 and 112, respectively.

The output terminal of the AND gate 115 is also connected to an input terminal of the OR gate 103. The output from the delay circuit 111 is input to an input terminal of the AND gate 115, and the output from the delay circuit 112 is input to the other input terminal of the AND gate 115 through the inverter 114.

The output terminal of the AND gate 105 is also connected to an input terminal of the OR gate 113. The output from the delay circuit 101 is input to an input terminal of the AND gate 105, and the output from the delay circuit 102 is input to the other input terminal of the AND gate 105 through the inverter 104.

The operation of the driving circuit in driving an ink chamber 51 of the Kaiser-type ink-jet head shown in FIGS. 3A to 3D will be described below with reference to FIGS. 16A to 16C. In the initial state, the PMOS transistors $P_{11}$, $P_{12}$, $P_{21}$, and $P_{22}$ are ON, and outputs OUTA and OUTB from the output circuits 81 and 82 are fixed at the driving voltage and have no potential difference.

When the ink chamber 51 is to be driven, first, a signal PA for turning off the PMOS transistors $P_{11}$ and $P_{12}$ of the A output circuit 81 is output from the logic circuit 29, voltage-converted by the level shifter 87, and input to the buffer $P_{12}$ of the prebuffer 84. The PMOS transistor $P_{12}$ driven with a high impedance is turned off.

The signal PA from the logic circuit 29 is delayed by the delay circuit 101 and becomes a signal PAD. On the other hand, a signal obtained by inverting an output NBD from the delay circuit 112 of the B output circuit 82 by the inverter 114 and a signal PBD from the delay circuit 111 are ANDed by the AND gate 115 (in this case, this signal does not change because no change occurs in the B output circuit 82).

The output from the AND gate 115 and the output PAD from the delay circuit 101 are input to the OR gate 103. The OR output is voltage-converted by the level shifter 86 and input to the buffer $P_{P11}$ of the prebuffer 84. With this operation, the PMOS transistor $P_{11}$ driven with a low impedance is turned off.

At this time, a signal obtained by inverting an output AND from the delay circuit 102 by the inverter 104 and the output PAD from the delay circuit 101 are ANDed by the AND gate 105. The AND signal and the output signal PBD from the delay circuit 111 of the B output circuit 82 are input to the OR gate 113. The OR output is voltage-converted by the level shifter 96 and input to the buffer $P_{P21}$ of the prebuffer 94. With this operation, the PMOS transistor $P_{21}$ (low impedance) of the B output circuit 82 is turned off (rise of the signal PAD).

After a time (tn1) for preventing the through current of the output circuit, a signal NA for turning on the NMOS transistors $N_{11}$ and $N_{12}$ of the output circuit 81 is output from the logic circuit 29, voltage-converted by the level shifter 89, and input to the buffer $P_{N12}$ of the prebuffer 85. The NMOS transistor $N_{12}$ driven with a high impedance is turned on.

In the B output circuit 82, since only the PMOS transistor $P_{22}$ driven with a high impedance is ON, small capacitance components (the junction capacitance of each element, the capacitances of the protective diodes, and the stray capacitance) except a piezoelectric member 21 as a capacitive load are charged at a high impedance. At this time, the output OUTB from the B output circuit 82 drops by an amount corresponding to the driving voltage division ratio of the NMOS transistor $N_{22}$ to the PMOS transistor $P_{22}$.

The signal NA from the logic circuit 29 charges the small capacitance components and is then delayed to the output AND by the delay circuit 102. This output AND is voltage-converted by the level shifter 88 and input to the buffer $P_{N11}$ of the prebuffer 85. The NMOS transistor $N_{11}$ driven with a low impedance is turned on.

At this time, as the signal AND rises, the PMOS transistor $P_{21}$ of the B output circuit 82 is turned on to set the outputs to a low impedance and reversely charge the piezoelectric member 21 as a load.

This state is held for a certain time. Next, the signal NA for turning off the NMOS transistor $N_{12}$ of the A output circuit 81 is output from the logic circuit 29, and the NMOS transistor $N_{12}$ driven with a high impedance is turned off.

The signal NA from the logic circuit 29 is delayed to the signal AND by the delay circuit 102. The NMOS transistor $N_{11}$ of the A output circuit 81, which is driven with a low impedance, is turned off by the signal AND.

As the signal AND from the delay circuit 102 falls, the PMOS transistor $P_{21}$ of the B output circuit 82, which is driven with a low impedance, is turned off. A state ready for turning on only the PMOS transistor $P_{22}$ of the B output circuit 82, which is driven with a high impedance, is set again.

At this time, even when the PMOS transistor $P_{21}$ of the B output circuit 82, which is driven with a low impedance, is turned off, the load is not affected because the reverse charge operation has been ended.

After a time (tn2) for preventing the through current of the output circuit, the PMOS transistor $P_{12}$ of the A output circuit 81 is turned on by the signal PA from the logic circuit 29. Both the PMOS transistors $P_{12}$ and $P_{22}$ of the output circuits 81 and 82 are turned on, and the small capacitance components are discharged at a high impedance. At this time, since the high-impedance PMOS transistors $P_{12}$ and $P_{22}$ are ON, the outputs OUTA and OUTB from the output circuits 81 and 82 rise by an amount corresponding to ½ the driving voltage.

After that, as the delay output PAD obtained by delaying the signal PA from the logic circuit 29 by the delay circuit 101 falls, the PMOS transistors $P_{11}$ and $P_{21}$ of the output circuits 81 and 82 are turned on, and the piezoelectric member 21 is discharged at low-impedance.

After the piezoelectric member 21 as a load is discharged to some degree, the PMOS transistor $P_{22}$ of the B output circuit 82 is turned off by the signal PB from the logic circuit 39. As the delay output PBD obtained by delaying the signal PB by the delay circuit 111 rises, the PMOS transistors $P_{11}$ and $P_{21}$ of the output circuits 81 and 82 are turned off.

After a time (tn3) for preventing the through current of the output circuit, the NMOS transistor $N_{22}$ of the B output circuit 82 is turned on by a signal NB from the logic circuit 39. In the A output circuit 81, since only the PMOS transistor $P_{12}$ driven with a high impedance is ON, the small capacitance components (the junction capacitance of each element, the capacitances of the protective diodes, and the stray capacitance) except the piezoelectric member 21 as a high-impedance capacitive load are charged. The output OUTA from the A output circuit 81 drops by an amount corresponding to the driving voltage division ratio of the NMOS transistor $N_{12}$ to the PMOS transistor $P_{12}$.

After this charge operation, as the delay output NBD obtained by delaying the signal NB from the logic circuit 39 by the delay circuit 112 rises, the PMOS transistor $P_{11}$ of the A output circuit 81 and the NMOS transistor $N_{21}$ of the B output circuit 82 are turned on to set the outputs to a low impedance and charge the piezoelectric member 21 as a load.

With the series of operations, a displacement corresponding twice the driving voltage VAA is generated between electrodes $21_1$ and $21_2$ of the piezoelectric member 21. The ink chamber 51 that is expanding rapidly contracts, and ink ejection starts.

After charging the load is ended, and this state is held for a predetermined time, the NMOS transistor $N_{22}$ of the B output circuit 82 is turned off by the output NB from the logic circuit 39. As the delayed output NBD obtained by delaying the output NB from the logic circuit 39 by the delay circuit 112 falls, the NMOS transistor $N_{21}$ of the B output circuit 82 and the PMOS transistor $P_{11}$ of the A output circuit 81 are turned off.

After a time (tn4) for preventing the through current of the output circuit, the PMOS transistor $P_{22}$ of the B output circuit 82, which is driven with a high impedance, is turned on by the signal PB from the logic circuit 39. The PMOS transistors $P_{12}$ and $P_{22}$ of the output circuits 81 and 82 are turned on to discharge the small capacitance components with a high impedance. Since the PMOS transistors $P_{12}$ and $P_{22}$ at a high impedance are turned on, the outputs OUTA and OUTB from the output circuits 81 and 82 rise by an amount corresponding to ½ the driving voltage VAA.

After that, as the delay output PBD obtained by delaying the signal PB from the logic circuit 39 by the delay circuit 111 falls, the PMOS transistors $P_{11}$ and $P_{21}$ of the output circuits 81 and 82 are turned on. The piezoelectric member 21 is discharged at low-impedance, and the state returns to the initial state.

As described above, when impedance control is performed such that the output OUTA or OUTB from the output circuit 81 or 82 is set to a high impedance at the start of change in the output OUTA or OUTB from the output circuit 81 or 82, the charge/discharge operation for the small capacitance moderates the change in voltage/current. For example, as shown in FIG. 17, a voltage V" when the voltage moderately changes corresponds to the driving voltage division ratio of the high impedance of the A output circuit 81 on the changing side to the high impedance of the B output circuit 82 affected by the output from the output circuit 81.

The impedance ratio of the PMOS transistor $P_{12}$ of the A output circuit 81, which is driven with a high impedance, to the NMOS transistor $N_{22}$ of the B output circuit 82, which is driven with a high impedance, is set to equal that of the MOS transistor $P_{12}$ and the MOS transistor $P_{11}$ driven with a low impedance to the MOS transistor $N_{22}$ driven with a high impedance and the MOS transistor $N_{21}$ driven with a low impedance. Also, the impedance ratio of the PMOS transistor $P_{22}$ of the B output circuit 82, which is driven with a high impedance, to the NMOS transistor $N_{12}$ of the A output circuit 81, which is driven with a high impedance, is set to equal that of the MOS transistor $P_{22}$ driven with a high impedance and MOS transistor $P_{21}$ driven with a low impedance to the MOS transistor $N_{12}$ driven with a high impedance and MOS transistor $N_{11}$ driven with a low impedance.

Furthermore, the impedance ratio of the PMOS transistors of the output circuits 81 and 82 is set to be $P_{12}:P_{22}=(P_{11}+P_{12}):(P_{21}+P22)$. This makes it possible to suppress variations in the outputs OUTA and OUTB in switching to the low impedance.

The fifth embodiment in which a capacitive element driving apparatus according to the present invention is applied to a Kaiser-type ink-jet head driving apparatus using a piezoelectric member will be described next with reference to FIGS. 18 and 19. The same reference numerals as in the above-described second embodiment denote the same parts in the third embodiment, and a detailed description thereof will be omitted.

Figure 18:
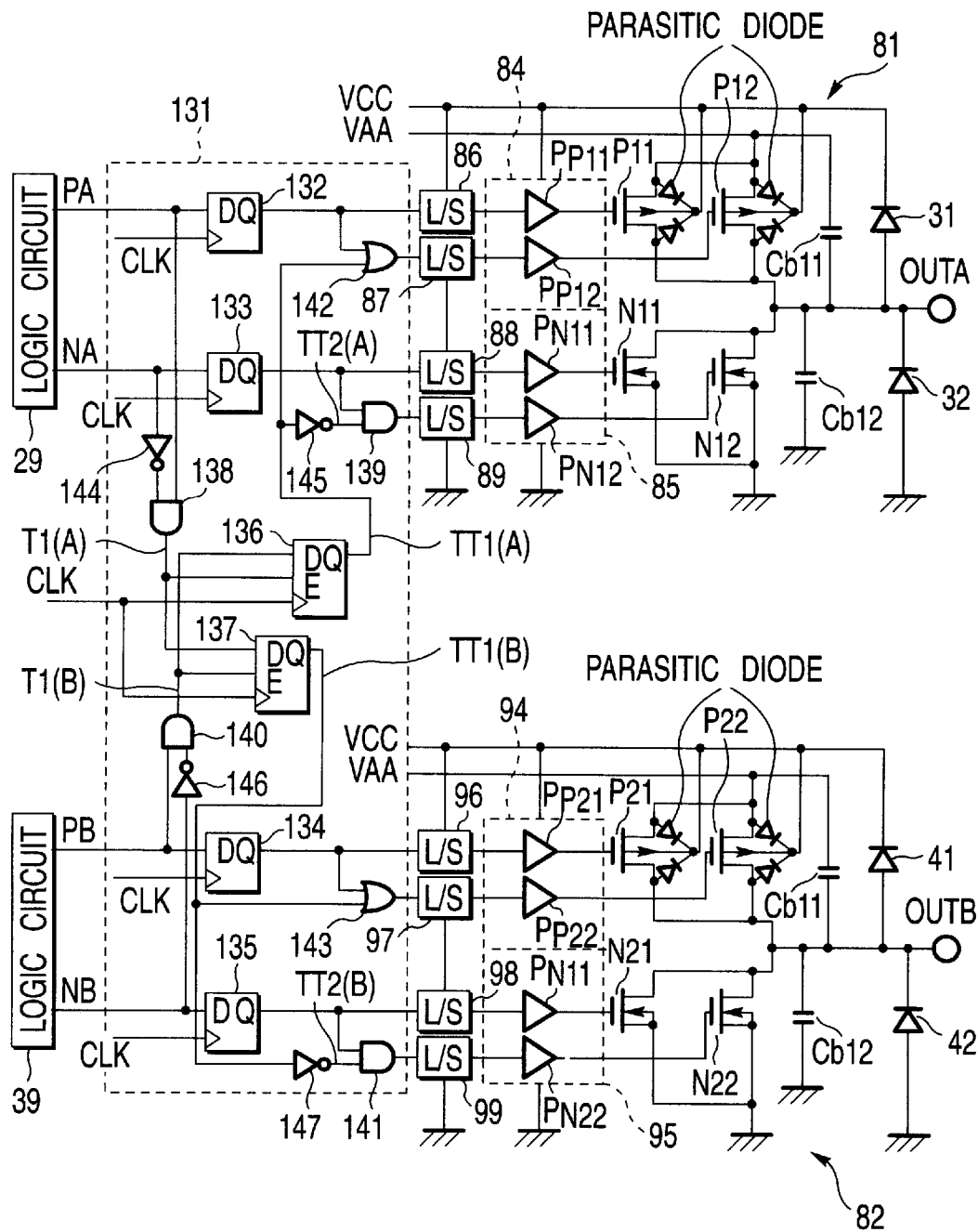
FIG. 18 is a block diagram showing the detailed circuit arrangement of a Kaiser-type ink-jet head driving apparatus according to the fifth embodiment of the present invention.
Figure 19:
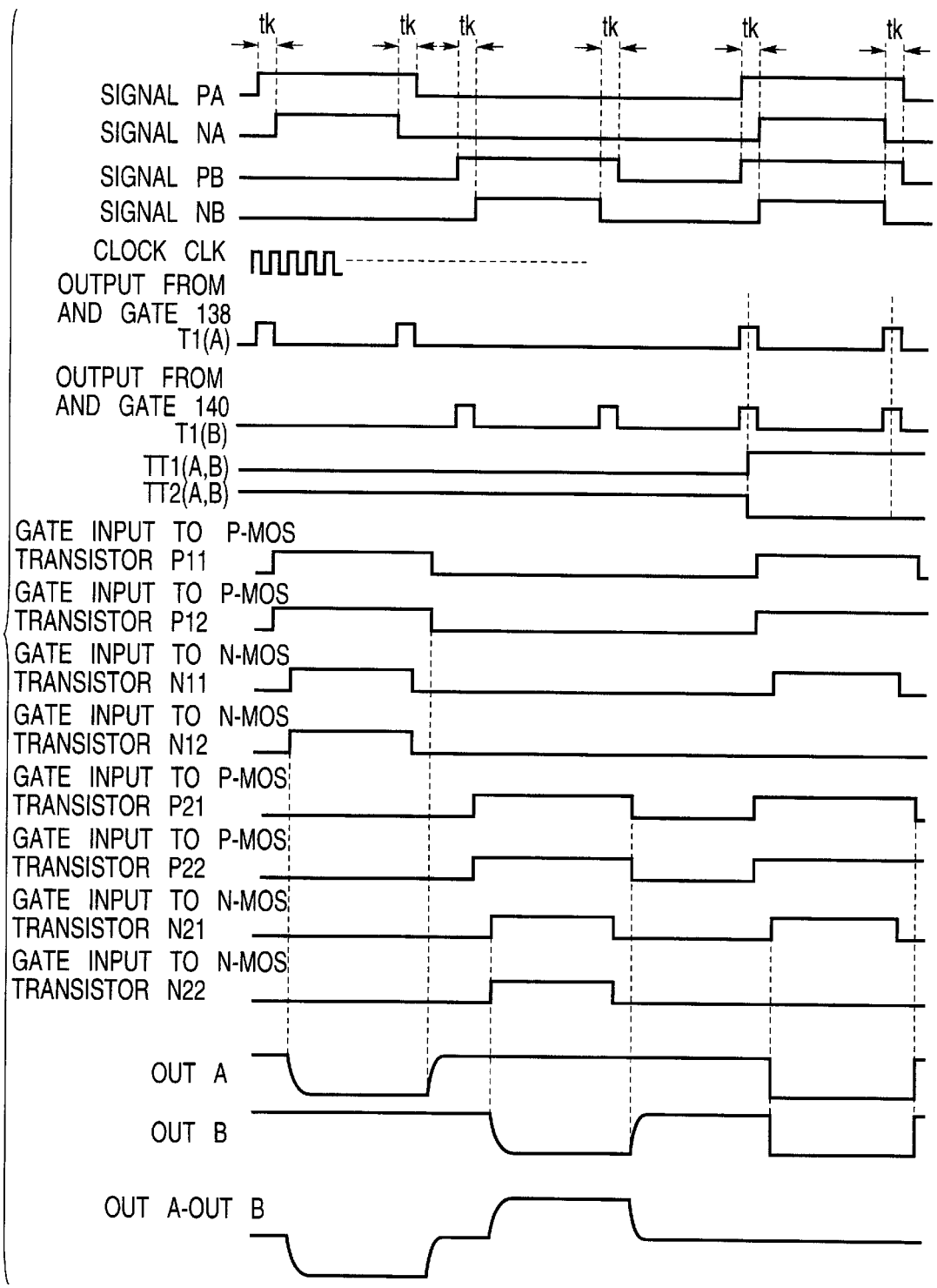
FIG. 19 is a timing chart showing the operation timing and application voltage waveforms of the circuit shown in FIG. 18.

FIG. 18 shows the detailed circuit arrangement of a driving circuit. This driving circuit uses a signal change detection circuit having an arrangement different from that of the driving circuit shown in FIG. 15. More specifically, a signal change detection circuit 131 comprises four D flip-flops 132, 133, 134, and 135, two D flip-flops 136 and 137 with enable terminals, four 2-input AND gates 138, 139, 140, and 141, two 2-input OR gates 142 and 143, and four inverters 144, 145, 146, and 147. A signal PA from a logic circuit 29 is input to the D (data) terminal of the D flip-flop 132 and one input terminal of the AND gate 138. A signal NA from the logic circuit 29 is input to the D (data) terminal of the D flip-flop 133 and the other input terminal of the AND gate 138 through the inverter 144.

A signal PB from a logic circuit 39 is input to the D (data) terminal of the D flip-flop 134 and one input terminal of the AND gate 140. A signal NB from the logic circuit 39 is input to the D (data) terminal of the D flip-flop 135 and the other input terminal of the AND gate 140 through the inverter 146.

The Q output from the D flip-flop 132 is input to a level shifter 86 of an A output circuit 81 and one input terminal of the OR gate 142. The Q output from the D flip-flop 133 is input to a level shifter 88 of the A output circuit 81 and one input terminal of the AND gate 139.

The Q output from the D flip-flop 134 is input to a level shifter 96 of a B output circuit 82 and one input terminal of the OR gate 143. The Q output from the D flip-flop 135 is input to a level shifter 98 of the B output circuit 82 and one input terminal of the AND gate 141.

The output from the AND gate 138 is input to the enable terminal of the D flip-flop 136 with an enable terminal and the D terminal of the D flip-flop 137 with an enable terminal. The output from the AND gate 140 is input to the enable terminal of the D flip-flop 137 with an enable terminal and the D terminal of the D flip-flop 136 with an enable terminal.

An external clock CLK is input to the D flip-flops 132 to 135, 136, and 137.

The Q output from the D flip-flop 136 with an enable terminal is input to the other input terminal of the OR gate 142 and to the other input terminal of the AND gate 139 through the inverter 145. The Q output from the D flip-flop 137 with an enable terminal is input to the other input terminal of the OR gate 143 and to the other input terminal of the AND gate 141 through the inverter 147.

The output from the OR gate 142 is input to a level shifter 87 of the A output circuit 81. The output from the AND gate 139 is input to a level shifter 89 of the A output circuit 81. The output from the OR gate 143 is input to a level shifter 97 of the B output circuit 82. The output from the AND gate 141 is input to a level shifter 99 of the B output circuit 82.

The operation of the driving circuit with this arrangement will be described with reference to FIG. 19.

First, to set an output OUTA from the A output circuit 81 at low level, the signal PA from the logic circuit 29 rises to turn off PMOS transistors $P_{11}$ and $P_{12}$ of the A output circuit 81. After a time tk delayed by one clock to prevent the through current when the PMOS transistors $P_{11}$ and $P_{12}$ and NMOS transistors $N_{11}$ and $N_{12}$ are simultaneously turned on, the signal NA for turning on the NMOS transistors $N_{11}$ and $N_{12}$ rises, and the output OUTA of low level is output from the A output circuit 81.

This state is held for a certain time. Next, to set the output OUTA at high level, the signal NA falls to turn off the NMOS transistors $N_{11}$ and $N_{12}$ of the A output circuit 81. After the through current prevention time tk, the signal PA falls to turn on the PMOS transistors $P_{11}$ and $P_{12}$.

To set an output OUTB from the B output circuit 82 to low level, the signal PB from the logic circuit 39 rises to turn off PMOS transistors $P_{21}$ and $P_{22}$ of the B output circuit 82. After the time tk delayed by one clock to prevent the through current when the PMOS transistors $P_{21}$ and $P_{22}$ and NMOS transistors $N_{21}$ and $N_{22}$ are simultaneously turned on, the signal NB for turning on the NMOS transistors $N_{21}$ and $N_{22}$ rises, and the output OUTB of low level is output from the B output circuit 82.

The rise operation of the output OUTA and the fall operation of the output OUTB are performed at a high speed, ink ejection starts. The low level state of the output OUTB is held for a certain time. After this, to set the output OUTB to high level, the signal NB falls to turn off the NMOS transistors $N_{21}$ and $N_{22}$ of the B output circuit 82. After the elapse of the through current prevention time tk, the signal PB falls to turn on the PMOS transistors $P_{21}$ and $P_{22}$. The output OUTB is set at high level and returns to the initial state. The ink ejection operation is performed in this way.

To inhibit ink ejection, the output waveform from the A output circuit 81, which is applied to the electrode of the ink chamber to eject ink, is made identical to that from the B output circuit 82, which is applied to the electrodes of ink chambers on both sides of the target ink chamber. In this case, since no potential difference is generated across the capacitive load, the ink ejection operation is not performed.

Next, detection of an adjacent output, i.e., detection of a change in output from the B output circuit 82 with respect to the output from the A output circuit 81 and a change in output from the A output circuit 81 with respect to the output from the B output circuit 82 will be described.

First, signals T1 that go high during the period tk when both the A output and B output have a high impedance are generated. These signals are used to detect the start of changes in the outputs because the outputs always change after the period tk. The signal on the A output circuit 81 side is represented by T1(A), and that on the B output circuit 82 side is represented by T1(B).

On the A output circuit 81 side, the signal T1(A) is input to the enable terminal of the D flip-flop 136 with an enable terminal, and the signal T1(B) is input to the D terminal of this D flip-flop 136.

When the signal T1(A) is at high level, and the signal T1(B) is also at high level, it is regarded that the outputs from the A output circuit 81 and B output circuit 82 simultaneously change in the same direction, and the low-impedance MOS transistors $P_{12}$ and $N_{12}$ are controlled not to be turned on.

On the B output circuit 82 side, the signal T1(B) is input to the enable terminal of the D flip-flop 137 with an enable terminal, and the signal T1(A) is input to the D terminal of this D flip-flop 137.

When the signal T1(B) is at high level, and the signal T1(A) is also at high level, it is regarded that the outputs from the B output circuit 82 and A output circuit 81 simultaneously change in the same direction, and the MOS transistors $P_{22}$ and $N_{22}$ at a low impedance are controlled not to be turned on.

When the signal T1(A) is at high level, and the signal T1(B) is at low level, or conversely, when the signal T1(B) is at high level, and the signal T1(A) is at low level, it is regarded that the charge or discharge operation is performed, and the MOS transistors $P_{22}$ and $N_{22}$ at a low impedance are controlled to be turned on.

For a share-mode ink-jet head in which the ink chambers are partitioned by partition walls as piezoelectric members, the output from the A output circuit 81 is applied to an electrode formed on an ink chamber to eject ink, the output from the B output circuit 82 is output to electrodes formed on ink chambers on both sides of the target ink chamber, and the partition walls on both sides are driven by the potential difference between the output from the A output circuit 81 and the output from the B output circuit 82. In this case, when both the output from the A output circuit 81 and the output from the B output circuit 82 change in the same direction, high-impedance control is performed.

More specifically, a signal obtained by ANDing signals that go high only when the adjacent outputs are at a high impedance is input to the D terminal of the D flip-flop with an enable terminal of the output. When the output from the flip-flop is at high level, i.e., when all the three outputs from the target and adjacent circuits, which go high only at a high impedance, simultaneously go high, only high-impedance MOS transistors perform switching operation.

With this control, when the load is to be charged/discharged, the circuit is driven at a high speed by low-impedance MOS transistors. When the outputs simultaneously change in the same direction, the outputs are moderately changed with a high impedance to reduce noise in changing the outputs.

The sixth embodiment in which a capacitive element driving apparatus according to the present invention is applied to a share-mode ink-jet head driving apparatus using a piezoelectric member will be described next with reference to FIGS. 20 to 26. The same reference numerals as in the above-described second embodiment denote the same parts in the sixth embodiment, and a detailed description thereof will be omitted.

Figure 20:
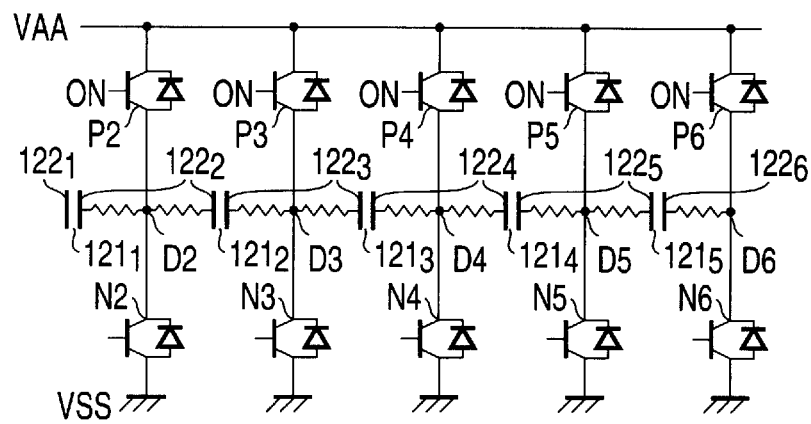
FIG. 20 is a circuit diagram showing the detailed circuit arrangement of a share-mode ink-jet head driving apparatus according to the sixth embodiment of the present invention.
Figure 21:
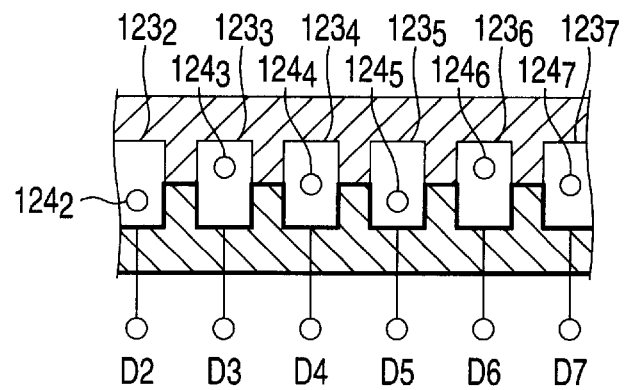
FIG. 21 is a partial sectional view showing the structure of an ink-jet head according to the sixth embodiment.

FIG. 20 is a circuit diagram showing the arrangement of part of the apparatus of this embodiment. FIG. 21 is a partial sectional view showing the structure of the share-mode ink-jet head. Referring to FIGS. 20 and 21, piezoelectric members $121_1$, $121_2$, $121_3$, $121_4$, $121_5$, $121_6$, . . . construct walls partitioning a plurality of ink chambers.

Electrodes are formed on the surfaces of the piezoelectric members $121_1$, $121_2$, $121_3$, $121_4$, $121_5$, $121_6$, . . . by, e.g., electroless nickel plating. More specifically, an electrode $122_1$ is formed on one surface of the piezoelectric member $121_1$. Electrodes $122_2$ are formed on the inner wall surfaces of an ink chamber $123_3$, i.e., the other surface of the piezoelectric member $121_1$ and one surface of the piezoelectric member $121_2$. Electrodes $122_3$ are formed on the inner wall surfaces of an ink chamber $123_3$, i.e., on the other surface of the piezoelectric member $121_2$ and one surface of the piezoelectric member $121_3$. Electrodes $122_4$ are formed on the inner wall surfaces of an ink chamber $123_4$, i.e., the other surface of the piezoelectric member $121_3$ and one surface of the piezoelectric member $121_4$. Electrodes $122_5$ are formed on the inner wall surfaces of an ink chamber $123_5$, i.e., the other surface of the piezoelectric member $121_4$ and one surface of the piezoelectric member $121_5$. Electrodes $122_6$ are formed on the inner wall surfaces of an ink chamber $123_6$, i.e., the other surface of the piezoelectric member $121_5$ and one surface of the piezoelectric member $121_6$. Electrodes are formed for the remaining piezoelectric members in the same way as described above, although they are not illustrated.

The plurality of ink chambers are divided into three groups every third chamber. More specifically, the ink chambers $123_2$, $123_5$, . . . having the electrodes $122_2$, $122_5$, . . . are put into a group B. The ink chambers $123_3$, $123_6$, . . . having the electrodes $122_3$, $122_6$, . . . are put into a group C. The ink chambers $123_4$, $123_7$, . . . having the electrodes $122_4$, . . . are put into a group A. The ink chambers $123_1$, $123_2$, $123_3$, $123_4$, $123_5$, . . . have ink ejection ports $124_1$, $124_2$, $124_3$, $124_4$, $124_5$, . . . respectively.

The electrodes $122_1$, $122_2$, $122_3$, $122_4$, $122_5$, . . . are connected to terminals $D_1$, $D_2$, $D_3$, $D_4$, $D_5$, $D_6$, . . . (to be referred to as terminals $D_1$ to $D_N$ hereinafter) through internal resistors, respectively. Parallel circuits of pnp transistors $P_1$ to $P_N$ as bipolar transistors or switching elements and diodes having a polarity shown in FIG. 20 are connected between a driving voltage VAA and the terminals $D_1$ to $D_N$, respectively. Parallel circuits of npn transistors $N_1$ to $N_N$ as bipolar transistors or switching elements and diodes having a polarity shown in FIG. 20 are connected between a ground voltage VSS and the terminals $D_1$ to $D_N$, respectively.

Figure 22:
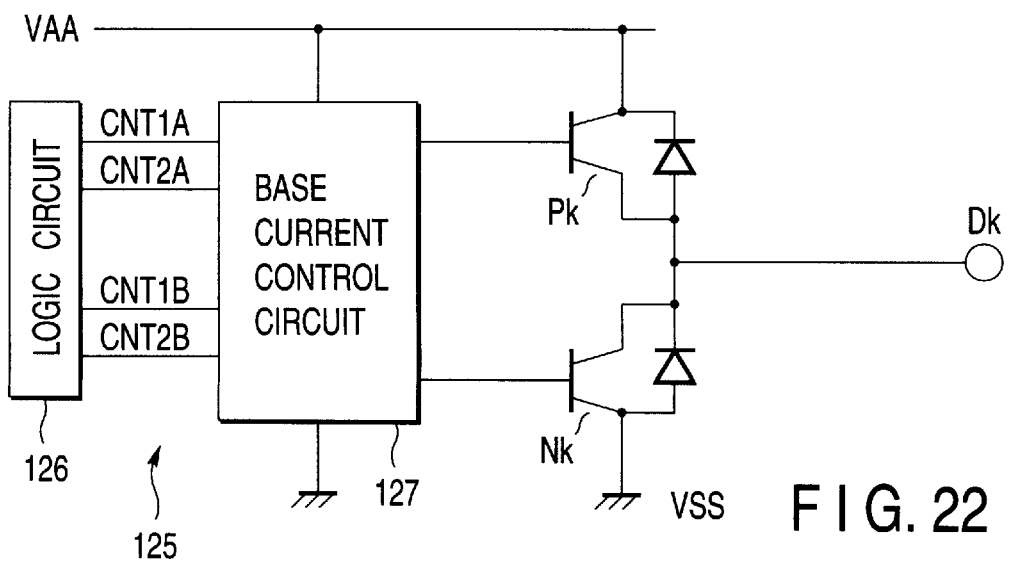
FIG. 22 is a circuit diagram showing the arrangement of a control circuit for controlling one output from the circuit shown in FIG. 20.

FIG. 22 shows a control circuit 125 for controlling the output from one terminal $D_K$ of the terminals $D_1$ to $D_N$. Such a control circuit is connected to each of the terminals $D_1$ to $D_N$. This control circuit 125 comprises a logic circuit 126 for outputting a signal CNT1A for turning on/off a pnp transistor $P_K$ with a small base current, a signal CNT2A for turning on/off the pnp transistor $P_K$ with a large base current, a signal CNT1B for turning on/off an npn transistor $N_K$ with a small base current, and a signal CNT2B for turning on/off the npn transistor $N_K$ with a large base current, and a base current control circuit 127 serving as an impedance control means for driving/controlling the bipolar transistors $P_K$ and $N_K$ on the basis of the signals from the logic circuit 126.

The operation of this driving circuit will be described below with reference to FIGS. 23A to 25C. In the initial states shown in FIG. 23A, the transistors $P_1$ to $P_N$ of the terminals $D_1$ to $D_N$ are ON, as shown in FIG. 20. The terminals $D_1$ to $D_N$ are held at an equipotential to the driving voltage VAA.

For example, to eject ink from the ink ejection port $124_3$ of the ink chamber $123_3$ of the group C, in correspondence with the terminal $D_3$, the signals CNT1A, CNT2A, CNT1B, and CNT2B are supplied from the logic circuit 126 to the base current control circuit 127, and base currents are supplied from the base current control circuit 127 to the bases of the transistors $P_3$ and $N_3$ at timings shown in FIG. 25A. In correspondence with the terminals $D_2$ and $D_4$, the signals CNT1A, CNT2A, CNT1B, and CNT2B are supplied from the logic circuit 126 to the base current control circuit 127, and base currents are supplied from the base current control circuit 127 to the bases of the transistors $P_2$ and $P_4$ and transistors $N_2$ and $N_4$ at timings shown in FIG. 25B.

Figure 23A:
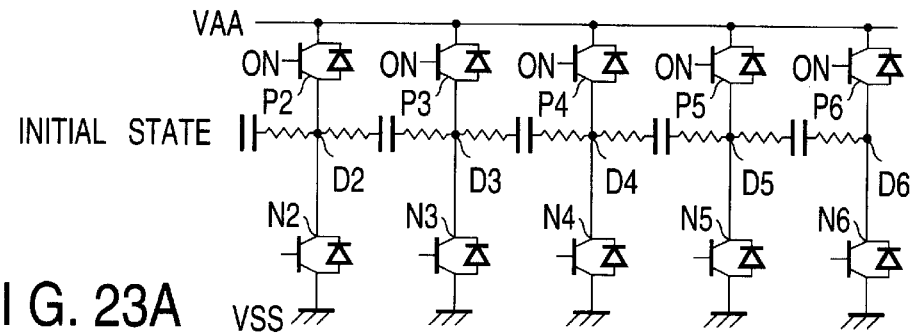
FIGS. 23A to 23E are circuit diagrams showing current flows in the operative states of the circuit in driving the ink-jet head of the sixth embodiment in units of three divisions.
Figure 23B:
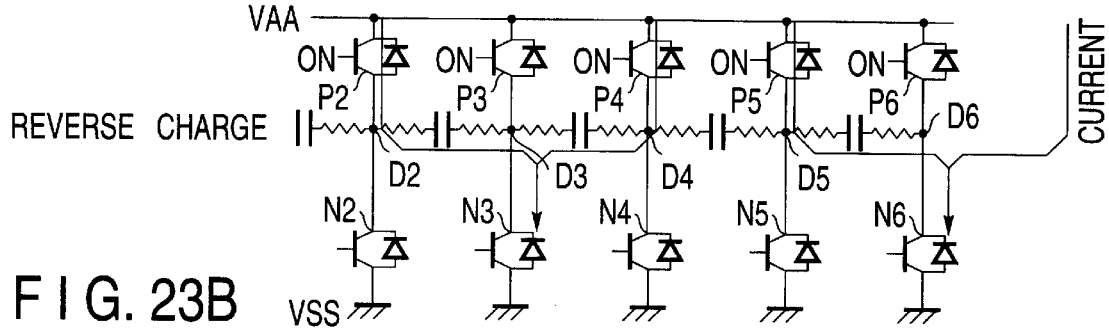

Therefore, when ink is to be ejected from the ink ejection ports $124_3$, $124_6$, . . . of the ink chambers $123_3$, $123_6$, . . . of the group C, the transistors $P_3$, $P_6$, . . . connected to the terminals $D_3$, $D_6$, . . . of the ink chambers $123_3$, $123_6$, . . . are turned off first. Then, after a time for preventing the through current, the transistors $N_3$, $N_6$, . . . are turned on. With this operation, a reverse charge operation shown in FIG. 23B is performed. At this time, the partition walls as piezoelectric members are deflected to expand the ink chambers $123_3$, $123_6$, . . . , as shown in FIG. 24A.

Figure 23C:
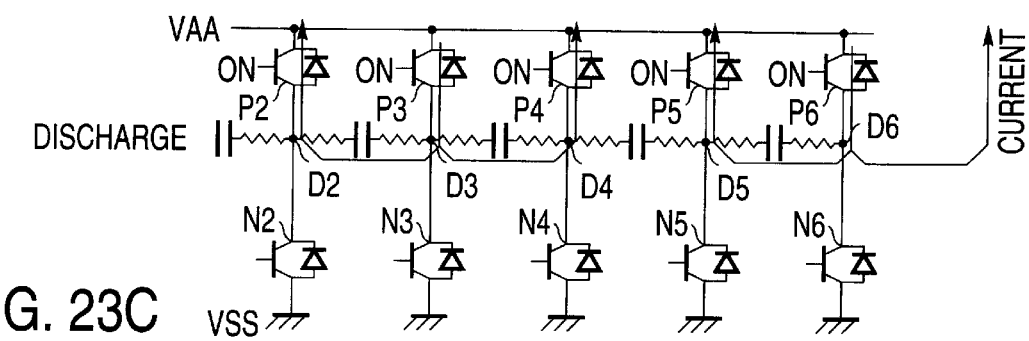

This state is held for a predetermined time. Next, the transistors $N_3$, $N_6$, . . . are turned off, and after a time for preventing the through current, the transistors $P_3$, $P_6$, . . . are turned on to reduce the potential difference between the terminals $D_3$, $D_6$, . . . and the adjacent terminals $D_2$, $D_4$, $D_5$, $D_7$, . . . . The discharge operation shown in FIG. 23C is performed. Since the potential difference applied to the partition walls as piezoelectric members becomes small, the partition walls as piezoelectric members tend to return to the initial state, as shown in FIG. 24B. When the transistors $P_3$, $P_6$, . . . are turned on, a current flows to the diodes of the transistors $P_2$, $P_4$, $P_5$, $P_7$, . . . for driving the adjacent terminals $D_2$, $D_4$, $D_5$, $D_7$, . . . .

Figure 23D:
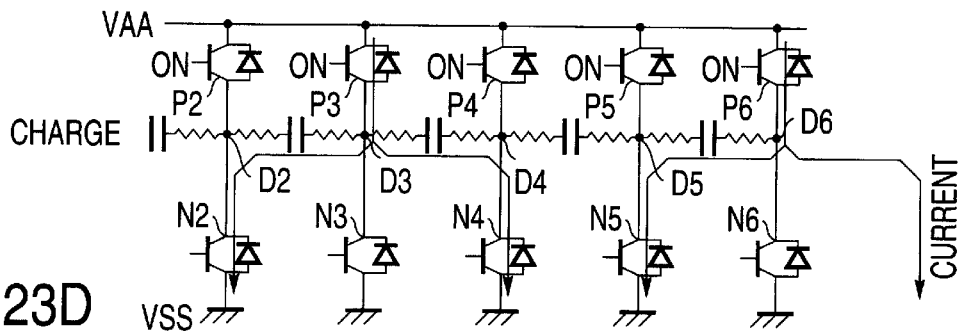

Following this discharge operation, the transistors $P_2$, $P_4$, $P_5$, $P_7$, . . . connected to the adjacent terminals $D_2$, $D_4$, $D_5$, $D_7$, . . . are turned off, and after a time for preventing the through current, the transistors $N_2$, $N_4$, $N_5$, $N_7$, . . . are turned on. The charge operation shown in FIG. 23D is performed. At this time, the partition walls as piezoelectric members are deflected to contract the ink chambers $123_3$, $123_6$, . . . , as shown in FIG. 24C.

When the reverse charge, discharge, and charge operations are performed at a high speed, an abrupt voltage change corresponding to twice the driving voltage VAA occurs in the partition walls as piezoelectric members, as shown in FIG. 25C. In accordance with this change, ink ejection from the ink chambers $123_3$, $123_6$, . . . starts.

Figure 23E:
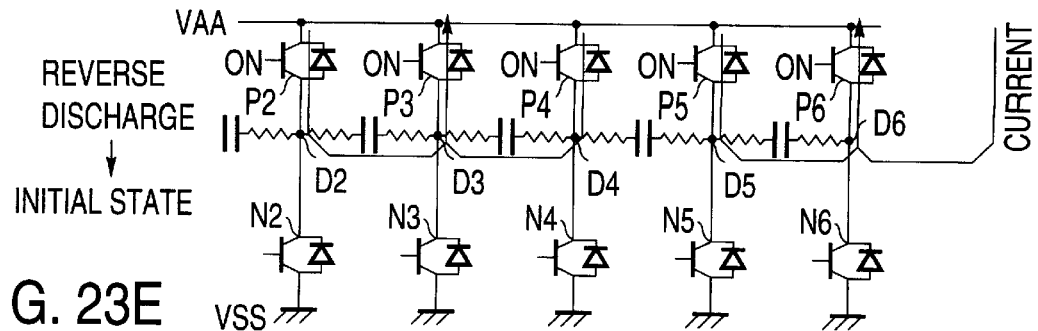
Figure 27:
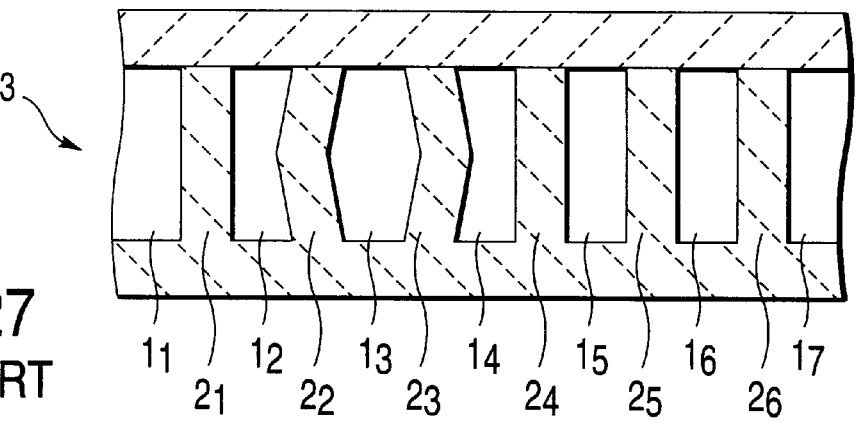
FIG. 27 is a partial sectional view showing the structure of a conventional share-mode ink-jet head.
Figure 28:
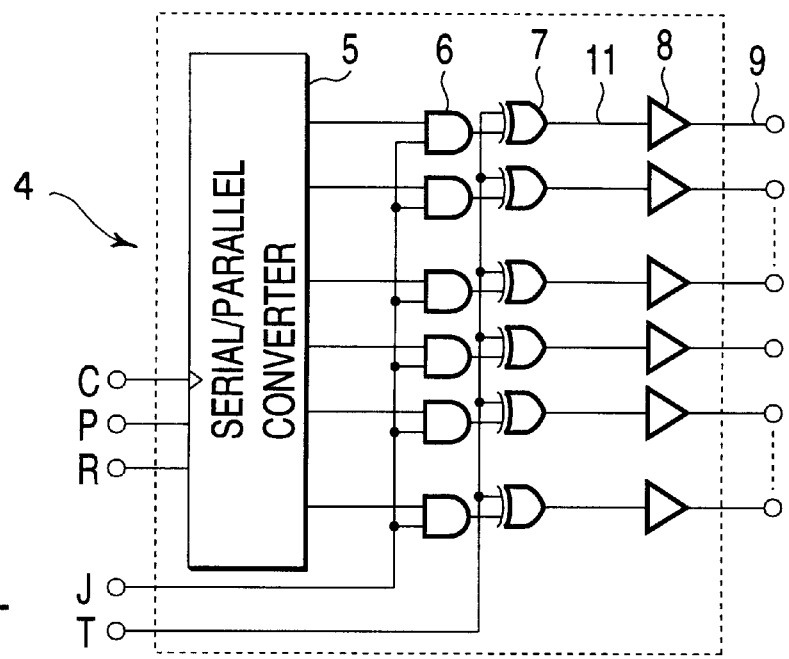
FIG. 28 is a block diagram showing the arrangement of a head driving apparatus of this prior art.
Figure 29:
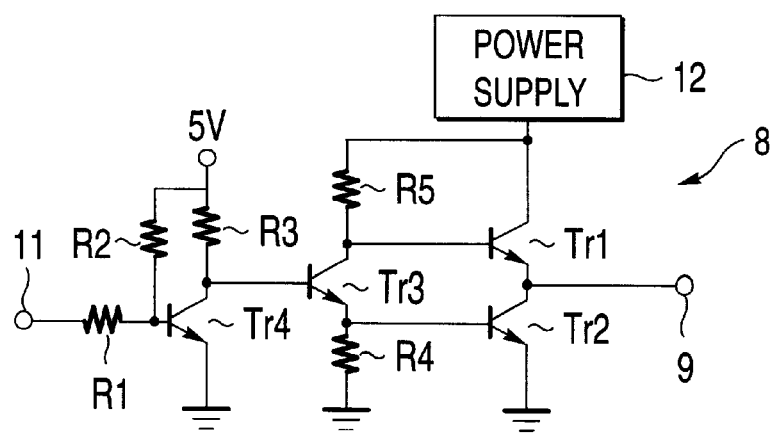
FIG. 29 is a detailed circuit diagram of the driving circuit of the conventional head driving apparatus.

After the start of ink ejection, this state is held for a predetermined time. The transistors $N_2$, $N_4$, $N_5$, $N_7$, . . . connected to the adjacent terminals $D_2$, $D_4$, $D_5$, $D_7$, . . . are turned off. After a time for preventing the through current, the transistors $P_2$, $P_4$, $P_5$, $P_7$, . . . are turned on. The reverse discharge operation shown in FIG. 23E is performed. With this operation, the partition wall as piezoelectric members return to the initial state shown in FIG. 24D. Ink in the ink chambers $123_3$, $123_6$, . . . is separated from the orifice surfaces of the ink ejection ports $124_3$, $124_6$, . . . and ejected. When the transistors $P_2$, $P_4$, $P_5$, $P_7$, . . . are turned on, a current flows to the diodes of the transistors $P_3$, $P_6$, . . . for driving the adjacent terminals $D_3$, $D_6$, . . . .

In this embodiment, the ink-jet head is driven in units of three divisions. Hence, after the ink chambers $123_3$, $123_6$, . . . of the group C are driven to print, the ink chambers $123_4$, $123_7$, . . . of the group A are driven to print, and finally, the ink chambers $123_2$, $123_5$, . . . of the group B are driven to print, thereby printing one line.

In this embodiment, when a transistor is to be turned on, the signals from the logic circuit 126 are controlled through the base current control circuit 127. At the start of change, the transistor is driven with a high impedance and a small base current. To charge/discharge the piezoelectric member as a load, the base current is made large to drive the transistor with a low impedance.

More specifically, as shown in FIGS. 25A to 25C, when the transistor $P_K$ or $N_K$ is to be turned on to change the output, first, the control signals CNT1A and CNT1B for supplying a small base current to the bases of the transistors $P_K$ and $N_K$ are output to the base current control circuit 127 to turn on the transistors $P_K$ and $N_K$ with a high impedance. After the elapse of a predetermined time, the control signals CNT2A and CNT2B for supplying a large base current to the bases of the transistors $P_K$ and $N_K$ are output to the base current control circuit 127 to turn on the transistors $P_K$ and $N_K$ with a low impedance, thereby charging/discharging a piezoelectric member 121.

As described above, impedance control is performed such that the transistors $P_K$ and $P_N$ are turned on with a high impedance first and then turned on with a low impedance to drive the piezoelectric member 121 as a load. In changing the outputs $D_1$ to $D_N$, the peak and gradient of the current for charging/discharging small capacitance components except for the load can be suppressed, and heat generation in the wiring resistance components of the driving circuit or head can be suppressed. In addition, the peak and gradient of the current that flows to the diodes between the collectors and emitters of the transistors $P_1$ to $P_N$ on the driving voltage side in driving the driving circuit can be suppressed, as indicated by a portion VF in FIG. 25C. This functions to suppress the operation of the parasitic transistor having the diode as a base.

If the ejection operation is not performed, the same waveform as that input to the adjacent ink chambers $123_2$ and $124_3$ is input to the ink chamber $123_3$ to be driven, as shown in FIG. 26. For this reason, the small junction capacitance of a transistor or stray capacitance is charged/discharged independently of the piezoelectric member 121. Hence, this embodiment is more advantageous than in the prior art because a driving apparatus free from noise and capable of obtaining a soft output switching operation can be provided.

If this operation is performed using a low-impedance transistor, as in the prior art, the output is switched at a high speed. This adversely affects radiation noise and also increases noise due to the steep current at the time of switching and the inductor components of wiring.

Figure 30:
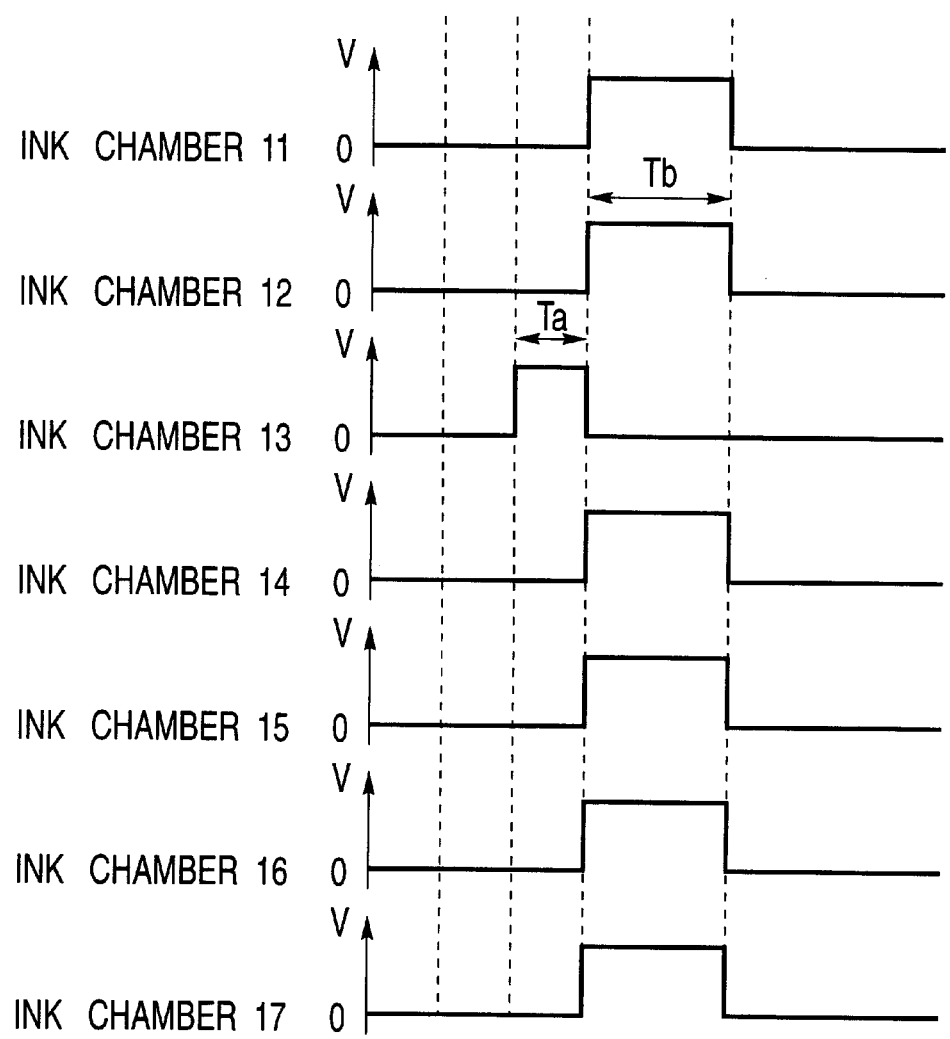
FIG. 30 is a timing chart showing the operation timing of the conventional head driving apparatus.
Figure 31:
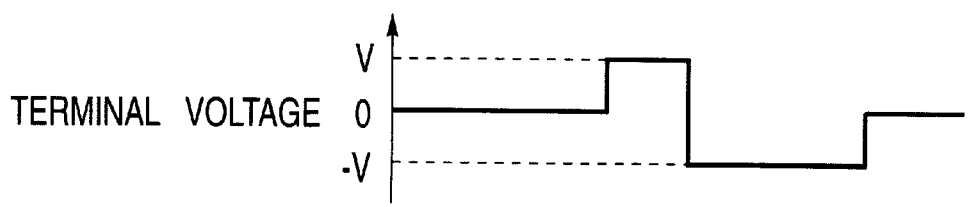
FIG. 31 is a timing chart showing an interterminal voltage waveform applied to the piezoelectric member of the conventional share-mode ink-jet head.

In the conventional control sequence shown in FIG. 30, the outputs from two electrodes are simultaneously inverted. Actually, the switching timing slightly shifts due to the delay by the switching element or logic circuit, and a current inevitably flows to the diode between the collector and emitter of the transistor. In this embodiment, however, the peak current flowing to the diode can be suppressed, and therefore a reliable driving apparatus can be provided. This embodiment is more advantageous than the prior art in this point as well.

The above-described embodiments, an ink-jet head using a piezoelectric member as a capacitive element is used, and this head is driven. However, the present invention is not limited to this. The present invention can also be applied to such a case that an apparatus or EL printhead using a liquid crystal element as a capacitive element, like a piezoelectric member, is driven.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A capacitive element driving apparatus comprising:
   a transducer forming a capacitive load;
   electrode potential control means for variably controlling potentials of two electrodes of an electrostatic capacitive element of said transducer; and
   impedance control means for, when potentials of the electrodes of the electrostatic capacitive element start changing under the control of said electrode potential control means, controlling an impedance of said electrode potential control means to a high impedance, and while a portion between the electrodes of the electrostatic capacitive element is being charged or discharged, controlling the impedance of said electrode potential control means to a low impedance lower than the high impedance.

2. An apparatus according to claim 1, further comprising:
   a same-direction detection circuit for detecting whether the potentials of the electrodes of the electrostatic capacitive element are changing in the same direction, and
   wherein when said same-direction detection circuit detects that the potentials of the electrodes of the electrostatic capacitive element are changing in the same direction under the control of said electrode potential control means, said impedance control means controls the impedance of said electrode potential control means to the high impedance, and while the portion between the electrodes of the electrostatic capacitive element is being charged or discharged, said impedance control means controls the impedance of said electrode potential control means to the low impedance lower than the high impedance.

3. An apparatus according to claim 1 wherein
   said electrode potential control means has a plurality of switching elements and controls ON/OFF timing of each switching element to change potentials to be applied to the electrodes of the electrostatic capacitive element, and
   when the potentials of the electrodes of the electrostatic capacitive element start changing under the control of said electrode potential control means, said impedance control means controls the impedance of said electrode potential control means to the high impedance, and while the portion between the electrodes of the electrostatic capacitive element of said transducer is being charged or discharged, said impedance control means controls the impedance of said electrode potential control means to the low impedance lower than the high impedance.

4. An apparatus according to claim 3, wherein
   each of said switching elements comprises a MOS transistor,
   said electrode potential control means ON/OFF-controls each MOS transistor by different gate voltages to change the potentials to be applied to the electrodes of the electrostatic capacitive element, and
   when the potentials of the electrodes start changing under the control of said electrode potential control means, said impedance control means drives the MOS transistor by a low gate voltage to set the impedance of said electrode potential control means to the high impedance, and while the portion between the electrodes of the electrostatic capacitive element is being charged or discharged, said impedance control means drives the MOS transistor at a high gate voltage to control the impedance of said electrode potential control means to the low impedance lower than the high impedance.

5. An apparatus according to claim 3, wherein
   each of said switching elements comprises a bipolar transistor,
   said electrode potential control means ON/OFF-controls each bipolar transistor by different base currents to change the potentials to be applied to the electrodes of the electrostatic capacitive element, and
   when the potentials of the electrodes start changing under the control of said electrode potential control means, said impedance control means drives the bipolar transistor with a small base current to set the impedance of said electrode potential control means to the high impedance, and while the portion between the electrodes of the electrostatic capacitive element is being charged or discharged, said impedance control means drives the bipolar transistor with a large base current to control the impedance of said electrode potential control means to the low impedance lower than the high impedance.

6. An apparatus according to claim 1, wherein said electrode potential control means comprises a first circuit for variably controlling the potential of one electrode of the electrostatic capacitive element, and a second circuit for variably controlling the potential of the other electrode of the electrostatic capacitive element, said apparatus further comprises a change detection circuit for detecting changes in signals input to said first circuit and said second circuit, and when the potentials of the electrodes start changing under the control of said electrode potential control means and when said change detection circuit detects that the signals start changing, said impedance control means controls the impedance of said electrode potential control means to the high impedance, and then to the low impedance lower than the high impedance.

7. An apparatus according to claim 6, wherein said electrode potential control means sets an impedance ratio between the two electrodes in high-impedance driving equal to an impedance ratio between the two electrodes in low-impedance driving.

8. An apparatus according to claim 1, wherein said electrode potential control means comprises a first circuit for variably controlling the potential of one electrode of the electrostatic capacitive element, and a second circuit for variably controlling the potential of the other electrode of the electrostatic capacitive element, said apparatus further comprises a change detection circuit for detecting changes in signals output from said first circuit and said second circuit, and when it is determined on the basis of a detection result from said change detection circuit that the signals input to said first and second circuits simultaneously change in the same direction, said impedance control means controls the impedance of said electrode potential control means to the high impedance, and while the electrodes of the electrostatic capacitive element of said transducer are charged or discharged, said impedance control means controls the impedance of said electrode potential control means to the low impedance lower than the high impedance.

9. An apparatus according to claim 8, wherein said electrode potential control means has a plurality of switching elements and ON/OFF-controls each switching element to change potentials to be applied to the electrodes of the electrostatic capacitive element, and said change detection circuit detects input logic values input to said first and second circuits, respectively, in order to ON/OFF-control each switching element, thereby detecting a change in the signal.

10. An apparatus according to claim 1, wherein the capacitive load comprises a piezoelectric member.

11. An apparatus according to claim 1, wherein the capacitive load comprises a liquid crystal element.

12. An apparatus according to claim 1, wherein the capacitive load comprises an EL.

* * * * *